US007293571B2

(12) United States Patent
Woods et al.

(10) Patent No.: US 7,293,571 B2
(45) Date of Patent: Nov. 13, 2007

(54) SUBSTRATE PROXIMITY PROCESSING HOUSING AND INSERT FOR GENERATING A FLUID MENISCUS

(75) Inventors: Carl Woods, Aptos, CA (US); Michael G. R. Smith, Dublin, CA (US); John Parks, Hercules, CA (US)

(73) Assignee: Lam Research Corporation, Fremont, CA (US)

( * ) Notice: Subject to any disclaimer, the term of this patent is extended or adjusted under 35 U.S.C. 154(b) by 593 days.

(21) Appl. No.: 10/817,355

(22) Filed: Apr. 1, 2004

(65) Prior Publication Data
US 2005/0148197 A1 Jul. 7, 2005

Related U.S. Application Data

(63) Continuation-in-part of application No. 10/261,839, filed on Sep. 30, 2002, now Pat. No. 7,234,477.

(51) Int. Cl.
*B08B 3/00* (2006.01)
(52) U.S. Cl. .................. 134/95.2; 134/102.3; 134/902
(58) Field of Classification Search .............. 134/95.1, 134/95.2, 99.1, 102.3, 167 R, 198, 902
See application file for complete search history.

(56) References Cited

U.S. PATENT DOCUMENTS

| | | | |
|---|---|---|---|
| 3,953,265 A | 4/1976 | Hood | |
| 4,086,870 A | 5/1978 | Canavello et al. | |
| 4,367,123 A | 1/1983 | Beck | |
| 4,444,492 A | 4/1984 | Lee | |
| 4,838,289 A | 6/1989 | Kottman et al. | ............ 134/153 |
| 5,102,494 A | 4/1992 | Harvey et al. | |
| 5,180,431 A | 1/1993 | Sugimoto et al. | |
| 5,271,774 A | 12/1993 | Leenaars et al. | ............. 134/31 |

(Continued)

FOREIGN PATENT DOCUMENTS

EP 0 905 746 A1 3/1999

(Continued)

OTHER PUBLICATIONS

Owa et al. "*Immersion lithography; its potential performance and issues*", Proceedings of the SPIE, SPIE, Bellingham, VA, US, vol. 5040, No. 1, Feb. 28, 2003, pp. 724-733, XP002294500.

(Continued)

*Primary Examiner*—Joseph L. Perrin
(74) *Attorney, Agent, or Firm*—Martine Penilla & Gencarella, LLP

(57) ABSTRACT

An apparatus for generating a fluid meniscus to be formed on a surface of a substrate is provided including a housing where the housing includes a housing surface to be placed proximate to a substrate surface of the substrate. The housing further includes a process configuration receiving region that is surrounded by the housing surface. The apparatus also includes a process configuration insert which has an insert surface where the process configuration insert is defined to fit within the process configuration receiving region of the housing such that the insert surface and the housing surface define a proximity face that can be placed proximate to the substrate surface of the substrate.

10 Claims, 17 Drawing Sheets

U.S. PATENT DOCUMENTS

| | | | |
|---|---|---|---|
| 5,294,257 A | 3/1994 | Kelly et al. | |
| 5,343,234 A | 8/1994 | Kuehnle | |
| 5,361,449 A | 11/1994 | Akimoto | |
| 5,472,502 A | 12/1995 | Batchelder | |
| 5,558,111 A | 9/1996 | Lofaro | |
| 5,601,655 A | 2/1997 | Bok et al. | |
| 5,660,642 A | 8/1997 | Britten | |
| 5,705,223 A | 1/1998 | Bunkofske | 427/240 |
| 5,807,522 A | 9/1998 | Brown et al. | |
| 5,830,334 A | 11/1998 | Kobayashi | |
| 5,882,433 A | 3/1999 | Ueno | |
| 5,893,004 A | 4/1999 | Yamamura | |
| 5,945,351 A | 8/1999 | Mathuni | 438/706 |
| 5,975,098 A | 11/1999 | Yoshitani et al. | |
| 5,989,478 A | 11/1999 | Ouellette et al. | |
| 5,997,653 A | 12/1999 | Yamasaka | 134/2 |
| 6,086,454 A | 7/2000 | Watanabe et al. | |
| 6,092,937 A | 7/2000 | Snodgrass et al. | |
| 6,103,636 A | 8/2000 | Zahorik et al. | |
| 6,108,932 A | 8/2000 | Chai | |
| 6,132,586 A | 10/2000 | Adams et al. | |
| 6,214,513 B1 | 4/2001 | Cai et al. | |
| 6,230,722 B1 | 5/2001 | Mitsumori et al. | |
| 6,341,998 B1 | 1/2002 | Zhang | |
| 6,382,861 B1 * | 5/2002 | Chen et al. | 401/203 |
| 6,391,166 B1 | 5/2002 | Wang | |
| 6,398,975 B1 | 6/2002 | Mertens et al. | 216/92 |
| 6,417,117 B1 | 7/2002 | Davis | |
| 6,446,358 B1 | 9/2002 | Mitsumori et al. | |
| 6,474,786 B2 | 11/2002 | Percin et al. | |
| 6,488,040 B1 * | 12/2002 | de Larios et al. | 134/95.2 |
| 6,491,764 B2 | 12/2002 | Mertens et al. | 134/36 |
| 6,495,005 B1 | 12/2002 | Colgan et al. | |
| 6,514,570 B1 | 2/2003 | Matsuyama et al. | |
| 6,530,823 B1 | 3/2003 | Ahmadi et al. | |
| 6,531,206 B2 | 3/2003 | Johnston et al. | |
| 6,550,988 B2 | 4/2003 | Sugimoto et al. | |
| 6,555,017 B1 | 4/2003 | Rushford et al. | |
| 6,616,772 B2 | 9/2003 | De Larios et al. | |
| 6,629,540 B2 | 10/2003 | Mitsumori et al. | |
| 6,954,993 B1 | 10/2005 | Smith et al. | |
| 6,988,326 B2 | 1/2006 | O'Donnell et al. | |
| 6,988,327 B2 | 1/2006 | Garcia et al. | |
| 7,000,622 B2 | 2/2006 | Woods et al. | |
| 7,069,937 B2 | 7/2006 | Garcia et al. | |
| 2002/0007869 A1 | 1/2002 | Pui et al. | |
| 2002/0020622 A1 | 2/2002 | Hanson et al. | |
| 2002/0121290 A1 | 9/2002 | Tang et al. | |
| 2002/0125212 A1 | 9/2002 | Mertens et al. | |
| 2003/0091745 A1 | 5/2003 | Yogev et al. | |
| 2003/0091754 A1 | 5/2003 | Chihani et al. | |
| 2003/0092264 A1 | 5/2003 | Shinji et al. | |
| 2003/0138968 A1 | 7/2003 | Fisher et al. | |
| 2004/0060573 A1 | 4/2004 | Woods | |
| 2004/0060581 A1 | 4/2004 | Garcia et al. | |
| 2004/0069319 A1 | 4/2004 | Boyd et al. | |
| 2004/0069329 A1 | 4/2004 | de Larios et al. | |
| 2004/0136494 A1 | 7/2004 | Lof et al. | |
| 2004/0178060 A1 | 9/2004 | Ravkin et al. | |
| 2004/0182422 A1 | 9/2004 | Boyd et al. | |
| 2005/0132515 A1 | 6/2005 | Boyd et al. | |
| 2005/0139318 A1 | 6/2005 | Woods et al. | |
| 2005/0145265 A1 | 7/2005 | Ravkin et al. | |
| 2005/0145267 A1 | 7/2005 | Korolik et al. | |
| 2005/0145268 A1 | 7/2005 | Woods | |
| 2005/0148197 A1 | 7/2005 | Woods et al. | |
| 2005/0217703 A1 | 10/2005 | O'Donnell | |
| 2006/0064895 A1 | 3/2006 | Garcia et al. | |

FOREIGN PATENT DOCUMENTS

| | | |
|---|---|---|
| EP | 0 905 747 A1 | 3/1999 |
| EP | 2003-151948 | 5/2003 |
| JP | 05837190 | 3/1983 |
| JP | 62150828 A | 7/1987 |
| JP | 02280330 | 11/1990 |
| JP | 02309638 | 12/1990 |
| JP | 08277486 | 10/1996 |
| JP | 11031672 | 2/1999 |
| JP | 11350169 | 12/1999 |
| WO | WO 99/49504 | 3/1999 |
| WO | WO 99/16109 A1 | 4/1999 |
| WO | WO 02/001613 A3 | 1/2002 |
| WO | WO 02/32825 A1 | 4/2002 |
| WO | WO 02/101795 A3 | 12/2002 |
| WO | WO 2004/030051 A2 | 4/2004 |
| WO | WO 03/014416 A2 | 2/2006 |

OTHER PUBLICATIONS

Lim et al., "*Atomic Layer deposition of transition metals*", Department of Chemistry and Chemical Biology, Harvard University, Nature Publishing Group, vol. 2, Nov. 2003, pp. 749-754.

ICKnowledge LLC, "*Technology Backgrounder: Atomic Layer Deposition*", ICKnowledge.com, 2004, pp. 1-7.

"*Chemical vapor deposition*", Wikipedia, the free encyclopedia, http://en.wikipedia.org/wiki/Chemical_vapor_deposition, 2005, p. 1-2.

Sigma-Aldrich, "*Atomic Layer Deposition (ALD)*", http://www.sigmaaldrich.com/Area_of_Interest/Chemistry/Materials_Science/Thin_Films, 2005, pp. 1-2.

J.A. Britten, "A moving-zone Marangoni drying process for critical cleaning and wet processing," Oct. 1997, *Solid State Technology*.

* cited by examiner

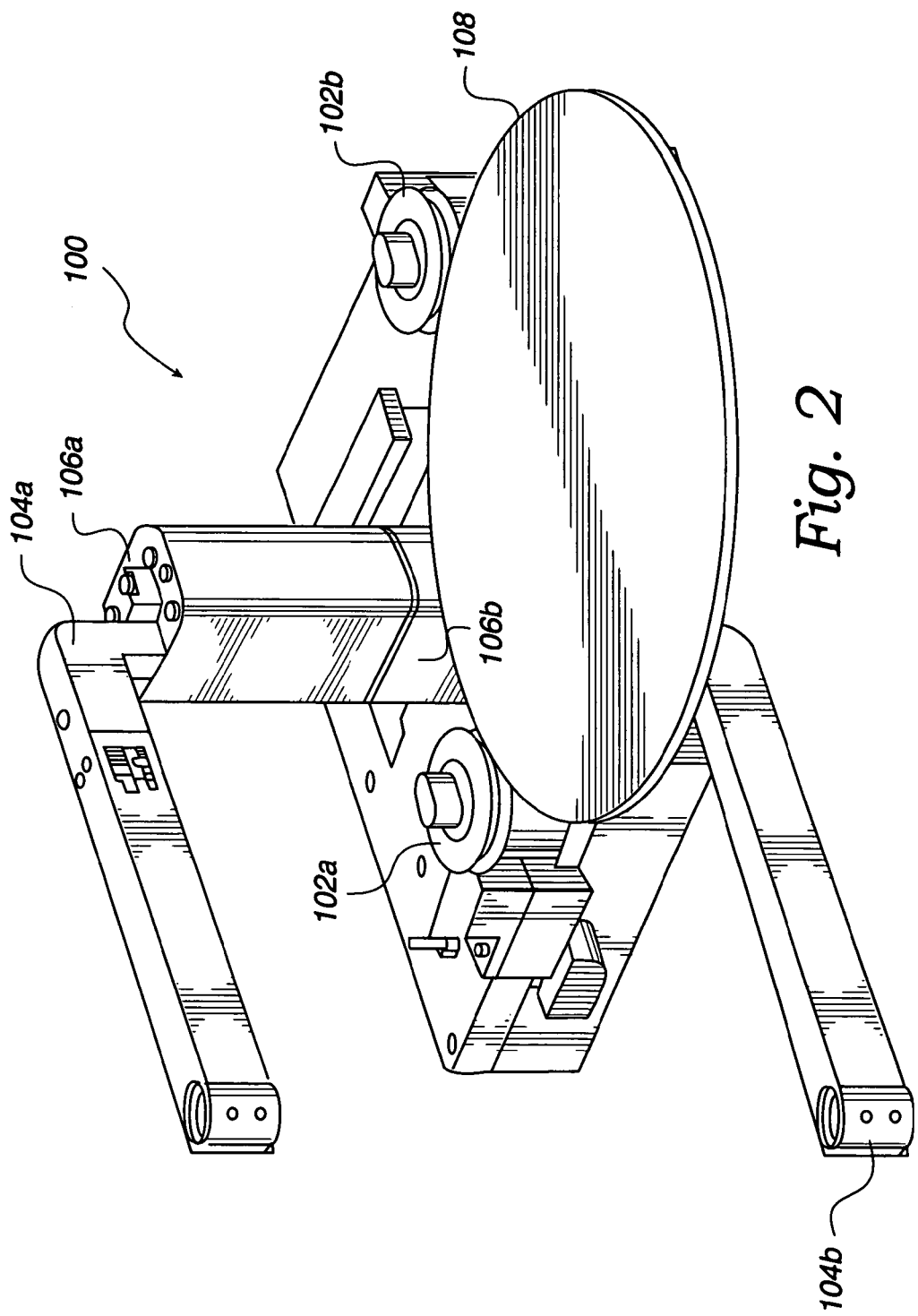

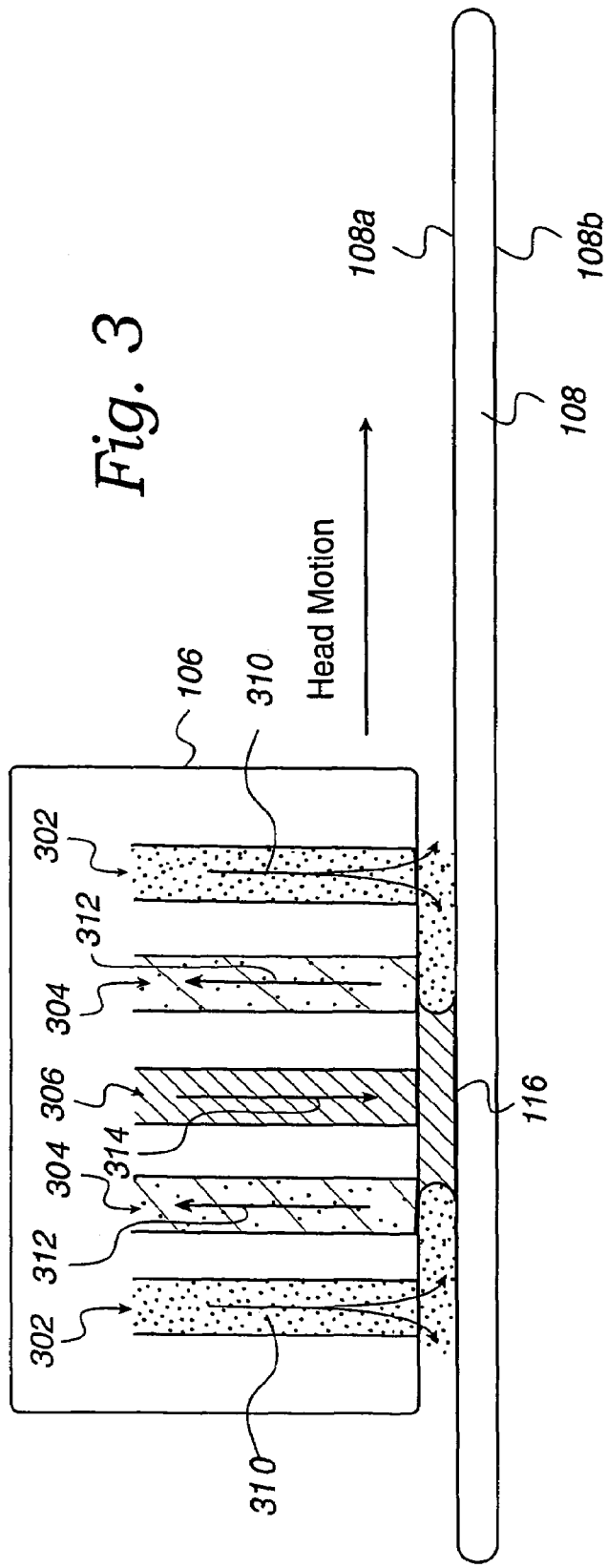

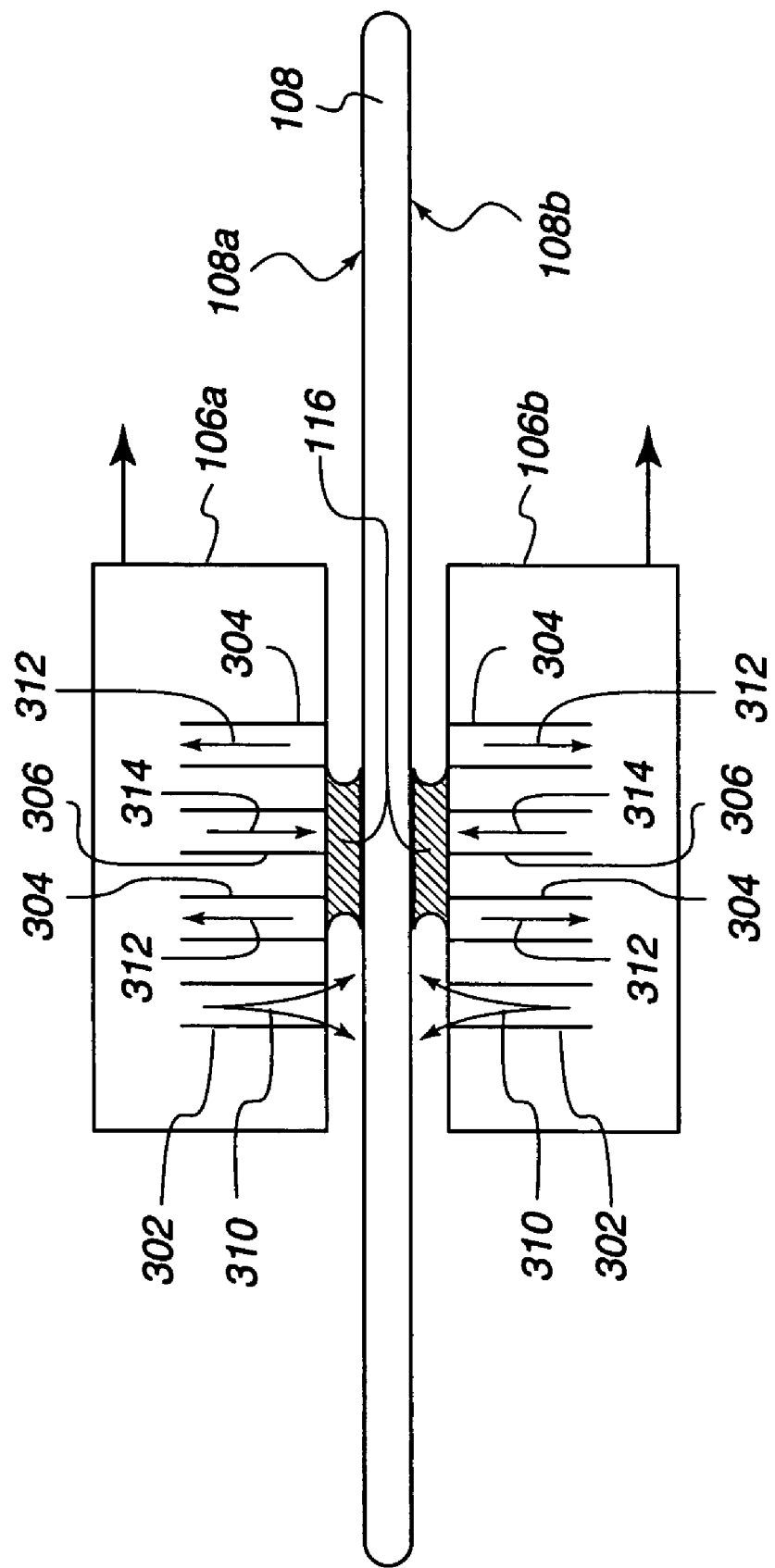

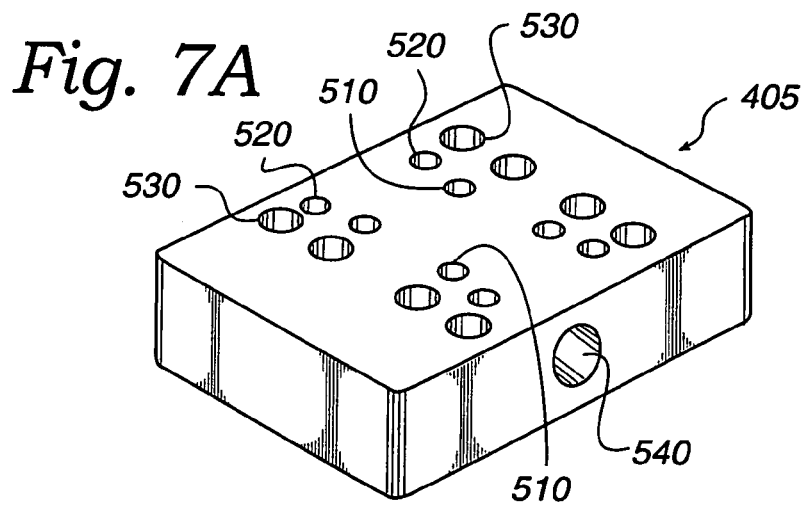
Fig. 7A
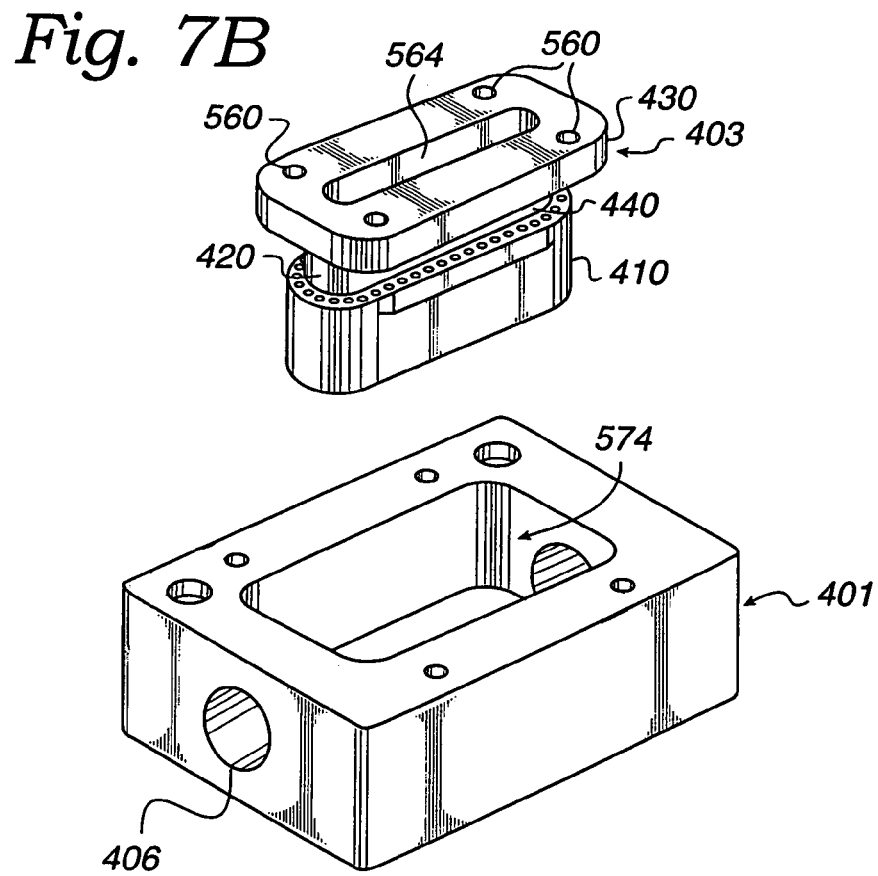
Fig. 7B
Fig. 7C

SUBSTRATE PROXIMITY PROCESSING HOUSING AND INSERT FOR GENERATING A FLUID MENISCUS

CROSS REFERENCE TO RELATED APPLICATION

This is a continuation-in-part of a U.S. patent application Ser. No. 10/261,839 now U.S. Pat. No. 7,234,477, from which priority under 35 U.S.C. § 120 is claimed, entitled "Method and Apparatus for Drying Semiconductor Wafer Surfaces Using a Plurality of Inlets and Outlets Held in Close Proximity to the Wafer Surfaces" filed on Sep. 30, 2002. The aforementioned patent application is hereby incorporated by reference.

BACKGROUND OF THE INVENTION

1. Field of the Invention

The present invention relates to semiconductor wafer processing and, more particularly, to apparatuses and techniques for more efficiently applying and removing fluids from wafer surfaces while reducing contamination and decreasing wafer cleaning cost.

2. Description of the Related Art

In the semiconductor chip fabrication process, it is well-known that there is a need to process a wafer using operations such as etching, cleaning, drying, and plating. In each of these types of operations, liquids are typically either applied or removed for the etching, cleaning, drying, and plating processes.

For example, wafer cleaning may have to be conducted where a fabrication operation has been performed that leaves unwanted residues on the surfaces of wafers. Examples of such a fabrication operation include plasma etching (e.g., tungsten etch back (WEB)) and chemical mechanical polishing (CMP). In CMP, a wafer is placed in a holder which pushes a wafer surface against a rolling conveyor belt. This conveyor belt uses a slurry which consists of chemicals and abrasive materials to cause the polishing. Unfortunately, this process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residues.

After a wafer has been wet cleaned, the wafer must be dried effectively to prevent water or cleaning fluid remnants from leaving residues on the wafer. If the cleaning fluid on the wafer surface is allowed to evaporate, as usually happens when droplets form, residues or contaminants previously dissolved in the cleaning fluid will remain on the wafer surface after evaporation (e.g., and form spots). To prevent evaporation from taking place, the cleaning fluid must be removed as quickly as possible without the formation of droplets on the wafer surface. In an attempt to accomplish this, one of several different drying techniques are employed such as spin drying, IPA, or Marangoni drying. All of these drying techniques utilize some form of a moving liquid/gas interface on a wafer surface which, if properly maintained, results in drying of a wafer surface without the formation of droplets. Unfortunately, if the moving liquid/gas interface breaks down, as often happens with all of the aforementioned drying methods, droplets form and evaporation occurs resulting in contaminants being left on the wafer surface. The most prevalent drying technique used today is spin rinse drying (SRD).

FIG. 1 illustrates movement of cleaning fluids on a wafer 10 during an SRD drying process. In this drying process, a wet wafer is rotated at a high rate by rotation 14. In SRD, by use of centrifugal force, the water or cleaning fluid used to clean the wafer is pulled from the center of the wafer to the outside of the wafer and finally off of the wafer as shown by fluid directional arrows 16. As the cleaning fluid is being pulled off of the wafer, a moving liquid/gas interface 12 is created at the center of the wafer and moves to the outside of the wafer (i.e., the circle produced by the moving liquid/gas interface 12 gets larger) as the drying process progresses. In the example of FIG. 1, the inside area of the circle formed by the moving liquid/gas interface 12 is free from the fluid and the outside area of the circle formed by the moving liquid/gas interface 12 is the cleaning fluid. Therefore, as the drying process continues, the section inside (the dry area) of the moving liquid/gas interface 12 increases while the area (the wet area) outside of the moving liquid/gas interface 12 decreases. As stated previously, if the moving liquid/gas interface 12 breaks down, droplets of the cleaning fluid form on the wafer and contamination may occur due to evaporation of the droplets. As such, it is imperative that droplet formation and the subsequent evaporation be limited to keep contaminants off of the wafer surface. Unfortunately, the present drying methods are only partially successful at the prevention of moving liquid/gas interface breakdown.

In addition, the SRD process has difficulties with drying wafer surfaces that are hydrophobic. Hydrophobic wafer surfaces can be difficult to dry because such surfaces repel water and water based (aqueous) cleaning solutions. Therefore, as the drying process continues and the cleaning fluid is pulled away from the wafer surface, the remaining cleaning fluid (if aqueous based) will be repelled by the wafer surface. As a result, the aqueous cleaning fluid will want the least amount of area to be in contact with the hydrophobic wafer surface. Additionally, the aqueous cleaning solution tends cling to itself as a result of surface tension (i.e., as a result of molecular hydrogen bonding). Therefore, because of the hydrophobic interactions and the surface tension, balls (or droplets) of aqueous cleaning fluid forms in an uncontrolled manner on the hydrophobic wafer surface. This formation of droplets results in the harmful evaporation and the contamination discussed previously. The limitations of the SRD are particularly severe at the center of the wafer, where centrifugal force acting on the droplets is the smallest. Consequently, although the SRD process is presently the most common way of wafer drying, this method can have difficulties reducing formation of cleaning fluid droplets on the wafer surface especially when used on hydrophobic wafer surfaces.

Additionally, in other wafer processing operations such as cleaning, etching, and plating, there are also problems with applying the fluids to the wafer and removing fluids from the wafer in an efficient manner that decreases contamination and increases wafer yield.

Therefore, there is a need for a method and an apparatus that avoids the prior art by enabling optimized fluid management and application to a wafer that reduces contaminating deposits on the wafer surface. Such deposits as often occurs today reduce the yield of acceptable wafers and increase the cost of manufacturing semiconductor wafers.

SUMMARY OF THE INVENTION

Broadly speaking, the present invention fills these needs by providing a substrate processing (e.g., drying, cleaning, etching, plating, etc.) apparatus that is capable of managing fluids on wafer surfaces while at the same time reducing wafer contamination. It should be appreciated that the present invention can be implemented in numerous ways, including as a process, an apparatus, a system, a device or a method. Several inventive embodiments of the present invention are described below.

In one embodiment, an apparatus for generating a fluid meniscus to be formed on a surface of a substrate is provided including a housing where the housing includes a housing surface to be placed proximate to a substrate surface of the substrate. The housing further includes a process configuration receiving region that is surrounded by the housing surface. The apparatus also includes a process configuration insert which has an insert surface where the process configuration insert is defined to fit within the process configuration receiving region of the housing such that the insert surface and the housing surface define a proximity face that can be placed proximate to the substrate surface of the substrate.

In another embodiment, an apparatus for generating a fluid meniscus to process a substrate is provided which includes a manifold head with a manifold surface having a plurality of conduits configured to generate a fluid meniscus on a substrate surface when in close proximity with the substrate. The manifold head has a plurality of passages capable of communicating fluids with the plurality of conduits. The apparatus also includes an interface membrane attached to a portion of the manifold head where the interface membrane configured to block a portion of the plurality of conduits.

In yet another embodiment, a method for processing a substrate using a process configuration insert defined within a housing is provided which includes applying a first fluid to a surface of the substrate through a first inlet of one of the housing and the process configuration insert. The method also includes applying a second fluid to a surface of the substrate through a second inlet of the process configuration insert, and removing the first fluid and the second fluid from the surface through an outlet of the process configuration insert.

In another embodiment, a method for processing a substrate using a process configuration insert capable of generating a fluid meniscus when defined within a manifold housing is provided. The method includes generating an additional process configuration insert capable of forming a different fluid meniscus when defined within the manifold housing where the different fluid meniscus has a different configuration than the fluid meniscus. The method further includes removing the process configuration insert from the manifold housing and attaching the additional process configuration insert to the manifold housing. The method also includes generating the different fluid meniscus on the substrate.

In yet another embodiment, a method for generating a fluid meniscus to process a substrate is provided. The method includes providing a proximity head capable of generating a fluid meniscus through application of a first fluid to the substrate from a first inlet and application of a second fluid to the substrate from a second inlet and removal of the first fluid and the second fluid from the substrate through an outlet. The method also includes blocking at least a portion of at least one of the first inlet, a first fluid passage to the first inlet, a second inlet, a second fluid passage to the second inlet, the outlet, and the third fluid passage from the outlet. The method further includes forming the fluid meniscus wherein at least one of a shape and size of the fluid meniscus is adjustable by varying a blocked portion of the at least one of the first inlet, a first fluid passage to the first inlet, a second inlet, a second fluid passage to the second inlet, the outlet, and the third fluid passage from the outlet.

The advantages of the present invention are numerous. Most notably, the apparatuses and methods described herein efficiently process (clean, dry, etch, plate, and other suitable type of wafer processing that involves optimal management of fluid application and/or removal from the wafer) semiconductor wafer while reducing unwanted fluids and contaminants remaining on a wafer surface. Consequently, wafer processing and production may be increased and higher wafer yields may be achieved due to efficient wafer processing.

The present invention enables the improved processing through the use of vacuum fluid removal in conjunction with processing fluid input that may be applied through usage of a multi-module manifold which is configurable in any one of numerous ways through the interchanging of one or more manifold sections.

The pressures generated on a fluid film at the wafer surface by the aforementioned forces enable optimal application and/or removal of fluid at the wafer surface with a significant reduction in remaining contamination as compared with other processing techniques. In addition, the present invention may utilize application of an isopropyl alcohol (IPA) vapor and processing fluid towards a wafer surface along with generation of a vacuum near the wafer surface at substantially the same time. This enables both the generation and intelligent control of a meniscus and the reduction of fluid surface tension along a processing fluid interface and therefore enables optimal application and/or removal of fluids from the wafer surface without leaving contaminants. The meniscus generated by input of IPA, processing fluid and output of fluids may be moved along the surface of the wafer to process the wafer.

In one exemplary embodiment, different process configuration inserts may be used for different types of wafer processing operations or alternatively different process configuration inserts may be utilized for a particular wafer processing operation when different meniscus configurations are desired. In such an embodiment, different process configuration inserts may form different sizes/shapes of meniscuses thereby enabling the optimal generation of a particular meniscus size/shape for a particular wafer processing operation.

Additionally the meniscus may be shaped by application of an interface membrane to the proximity head to block the input of fluid into certain portions of the fluid meniscus that is formed on the wafer surface. Therefore, by blocking fluid transportation in specific portions of the proximity head, portions of the meniscus may be eliminated so the meniscus may be configured to a specific shape that is optimal for a particular wafer processing operation. Therefore, depending on the process desired and the meniscus configuration required, different numbers and shapes of the interface membrane may be applied to any suitable portion of the proximity head to block particular fluid paths resulting in different meniscus configurations.

Moreover, the interface membrane can reduce the development time to produce a desired manifold. Therefore, the interface membrane can enable rapid development of prototype hardware and processes as well as enabling testing and recording of data in real time due to the ability to rapidly change the meniscus configuration generated by a particular proximity head/manifold design. As a result, the interface membrane may also enable rapid prototyping, development and testing of different manifold process windows (e.g., different sizes, shapes, and size definitions).

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 2 shows a wafer processing system in accordance with one embodiment of the present invention.

FIG. 3 illustrates a proximity head performing a wafer processing operation in accordance with one embodiment of the present invention.

FIG. 4B illustrates a side view of exemplary proximity heads for use in a dual wafer surface processing system in accordance with one embodiment of the present invention.

FIG. 7A illustrates a bottom view of the cover module in accordance with one embodiment of the present invention.

FIG. 7B shows a bottom view of the process configuration insert in accordance with one embodiment of the present invention.

FIG. 7C illustrates a bottom view of a housing module in accordance with one embodiment of the present invention.

DETAILED DESCRIPTION

Figure 1:
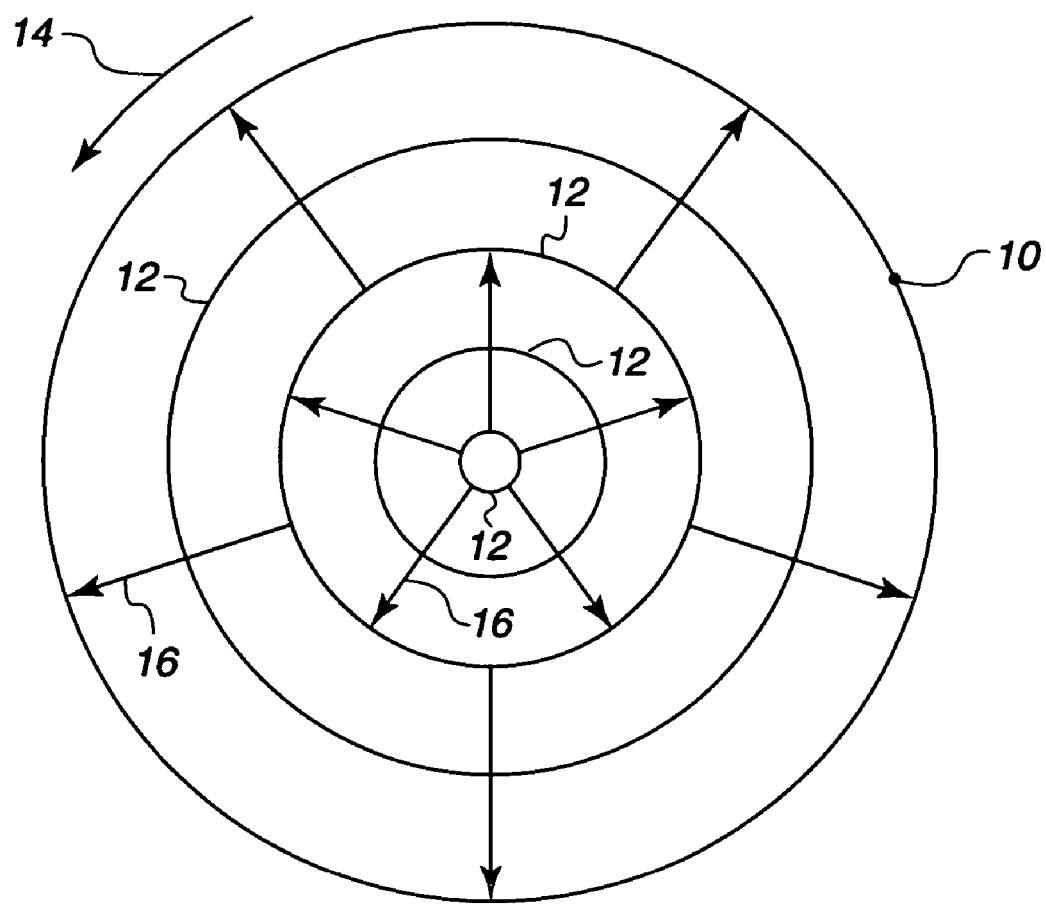
FIG. 1 illustrates movement of cleaning fluids on a wafer during an SRD drying process.

An invention for methods and apparatuses for processing a substrate is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferable embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

The figures below illustrate embodiments of an exemplary wafer processing system using multi-module proximity heads and interface membranes to generate a specific shape, size, and location of a fluid meniscus. In one embodiment, the technology utilized herein may be known as a meniscus vacuum IPA vapor (MVIV) technology. This technology may be utilized to perform any suitable type of wafer operation such as, for example, meniscus vacuum IPA vapor drying (MVIVD), meniscus vacuum IPA vapor cleaning (MVIVC), meniscus vacuum IPA vapor etching (MVIVE), meniscus vacuum IPA vapor plating (MVIVP), etc. It should be appreciated that the system is exemplary, and that any other suitable type of configuration that would enable movement of the proximity head(s) into close proximity to the wafer may be utilized. In the embodiments shown, the proximity head(s) may move in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, in a random motion, etc. In addition, the motion may also be any suitable specified motion profile as desired by a user. In addition, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer. In addition, the proximity head and the wafer processing system as described herein may be utilized to process any shape and size of substrates such as for example, 200 mm wafers, 300 mm wafers, flat panels, etc. The processing system may be configured to be utilized for any suitable processing (e.g., plating, etching, cleaning, drying, etc.) of the wafer depending on the configuration of the system. In yet another embodiment, megasonics may be utilized with the fluid meniscus to enhance wafer processing.

A fluid meniscus can be supported and moved (e.g., onto, off of and across a wafer) with a proximity head. Various proximity heads and methods of using the proximity heads are described in co-owned U.S. patent application Ser. No. 10/330,843 filed on Dec. 24, 2002 and entitled "Meniscus, Vacuum, IPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in its entirety. Additional embodiments and uses of the proximity head are also disclosed in U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,692, filed on Mar. 31, 2003, entitled "Methods and Systems for Processing a Substrate Using a Dynamic Liquid Meniscus." Still additional embodiments of the proximity head are described in U.S. patent application Ser. No. 10/404,270, filed on Mar. 31, 2003, entitled "Vertical Proximity Processor," U.S. patent application Ser. No. 10/603,427, filed on Jun. 24, 2003, and entitled "Methods and Systems for Processing a Bevel Edge of a Substrate Using a Dynamic Liquid Meniscus," U.S. patent application Ser. No. 10/606,022, filed on Jun. 24, 2003, and entitled "System and Method for Integrating In-Situ Metrology within a Wafer Process," U.S. patent application Ser. No. 10/607,611 filed on Jun. 27, 2003 entitled "Apparatus and Method for Depositing and Planarizing Thin Films of Semiconductor Wafers," U.S. patent application Ser. No. 10/611,140 filed on Jun. 30, 2003 entitled "Method and Apparatus for Cleaning a Substrate Using Megasonic Power," and U.S. patent application Ser. No. 10/742,303 entitled "Proximity Brush Unit Apparatus and Method." The aforementioned patent applications are hereby incorporated by reference in their entirety.

It should be appreciated that the system described herein is just exemplary in nature, and the multi-module proximity head and the proximity head utilizing one or more interface membranes may be used in any suitable system such as, for example, those described in the United States Patent Applications referenced above. It should also be understood that by either using interchangeable process configuration inserts and/or interface membranes, the configuration/shape/size/location of the meniscus may be changed. In one embodiment, different process configuration inserts may have different inlet and outlet configurations thereby generating different shape and size meniscuses in different locations when the proximity head is in operation. In another embodiment, interface membrane(s) may be applied to a proximity head in pathways and/or locations where fluid is traveling. In such a fashion, portions of the meniscus may be eliminated or increased in size in particular proximity head locations that correspond to a certain shape/size/location of the interface membrane(s). Therefore, parts of the meniscus may be removed or increased in size to leave a customized meniscus shape, size, and location. Consequently, by using different shape/size interface membrane(s) on a face of the proximity head and/or fluid input/pathway areas of the proximity head, different size and shape meniscuses in different locations may be formed with a single type of proximity head.

FIG. 2 shows a wafer processing system 100 in accordance with one embodiment of the present invention. The system 100 includes rollers 102a and 102b which may hold and/or rotate a wafer to enable wafer surfaces to be processed. The system 100 also includes proximity heads 106a and 106b that, in one embodiment, are attached to an upper arm 104a and to a lower arm 104b respectively. In one embodiment, the proximity heads 106a and/or 106b may be multi-module proximity heads as described in further detail in reference to FIGS. 5 through 8. As described herein the term "multi-module proximity head" is a proximity head having one or more components. The proximity head may be any suitable apparatus that may generate a fluid meniscus. In another embodiment, the proximity heads 106a and/or 106b may be proximity head(s) with one or more interface membranes as discussed in further detail in reference to FIGS. 9A through 10C. In yet another embodiment, one of the proximity heads 106a and 106b may be a multi-module proximity head while the other may be the proximity head utilizing the one or more interface membranes. The upper arm 104a and the lower arm 104b can be part of an assembly which enables substantially linear movement of the proximity heads 106a and 106b along a radius of the wafer. In yet another embodiment, the assembly may move the proximity heads 106a and 106b in any suitable user defined movement.

In one embodiment the arms 104 are configured to hold the proximity head 106a above the wafer and the proximity head 106b below the wafer in close proximity to the wafer. For example, in one exemplary embodiment this may be accomplished by having the upper arm 104a and the lower arm 104b be movable in a vertical manner so once the proximity heads are moved horizontally into a location to start wafer processing, the proximity heads 106a and 106b can be moved vertically to a position in close proximity to the wafer. In another embodiment, the upper arm 104a and the lower arm 104b may be configured to start the proximity heads 106a and 106b in a position where a meniscus is generated before processing and the meniscus that has already been generated between the proximity heads 106a and 106b may be moved onto the wafer surface to be processed from an edge area of a wafer 108. Therefore, the upper arm 104a and the lower arm 104b may be configured in any suitable way so the proximity heads 106a and 106b can be moved to enable wafer processing as described herein. It should also be appreciated that the system 100 may be configured in any suitable manner as long as the proximity head(s) may be moved in close proximity to the wafer to generate and control a meniscus. It should also be understood that close proximity may be any suitable distance from the wafer as long as a meniscus may be maintained. In one embodiment, the proximity heads 106a and 106b (as well as any other proximity head described herein) may each be located between about 0.1 mm to about 10 mm from the wafer to generate the fluid meniscus on the wafer surface. In a preferable embodiment, the proximity heads 106a and 106b (as well as any other proximity head described herein) may each be located about 0.5 mm to about 2.0 mm from the wafer to generate the fluid meniscus on the wafer surface, and in more preferable embodiment, the proximity heads 106a and 106b (as well as any other proximity head described herein) may be located about 1.5 mm from the wafer to generate the fluid meniscus on the wafer surface.

In one embodiment, the system 100, the arms 104 are configured to enable the proximity heads 106a and 106b to be moved from processed to unprocessed portions of the wafer. It should be appreciated that the arms 104 may be movable in any suitable manner that would enable movement of the proximity heads 106a and 106b to process the wafer as desired. In one embodiment, the arms 104 may be motivated by a motor to move the proximity head 106a and 106b along the surface of the wafer. It should be understood that although the wafer processing system 100 is shown with the proximity heads 106a and 106b, that any suitable number of proximity heads may be utilized such as, for example, 1, 2, 3, 4, 5, 6, etc. The proximity heads 106a and/or 106b of the wafer processing system 100 may also be any suitable size or shape as shown by, for example, any of the proximity heads as described herein. The different configurations described herein generate a fluid meniscus between the proximity head and the wafer. The fluid meniscus may be moved across the wafer to process the wafer by applying fluid to the wafer surface and removing fluids from the surface. In such a way, depending on the fluids applied to the wafer, cleaning, drying, etching, and/or plating may be accomplished. Therefore, the proximity heads 106a and 106b can have any numerous types of configurations as shown herein or other configurations that enable the processes described herein. It should also be appreciated that the system 100 may process one surface of the wafer or both the top surface and the bottom surface of the wafer.

In addition, besides processing the top and/or bottom surfaces of the wafer, the system 100 may also be configured to process one side of the wafer with one type of process (e.g., etching, cleaning, drying, plating, etc.) and process the other side of the wafer using the same process or a different type of process by inputting and outputting different types of fluids or by using a different configuration meniscus. The proximity heads can also be configured to process the bevel edge of the wafer in addition to processing the top and/or bottom of the wafer. This can be accomplished by moving the meniscus off (or onto) the edge of the wafer to process the bevel edge. It should also be understood that the proximity heads 106a and 106b may be the same type of apparatus or different types of proximity heads.

The wafer 108 may be held and rotated by the rollers 102a and 102b in any suitable orientation as long as the orientation enables a desired proximity head to be in close proximity to a portion of the wafer 108 that is to be processed. In one embodiment, the rollers 102a and 102b can rotate in a clockwise direction to rotate the wafer 108 in a counterclockwise direction. It should be understood that the rollers may be rotated in either a clockwise or a counterclockwise direction depending on the wafer rotation desired. In one embodiment, the rotation imparted on the wafer 108 by the rollers 102a and 102b serves to move a wafer area that has not been processed into close proximity to the proximity heads 106a and 106b. However, the rotation itself does not dry the wafer or move fluid on the wafer surfaces towards the edge of the wafer. Therefore, in an exemplary wafer processing operation, the unprocessed areas of the wafer would be presented to the proximity heads 106a and 106b through both the linear motion of the proximity heads 106a and 106b and through the rotation of the wafer 108. The wafer processing operation itself may be conducted by at least one of the proximity heads. Consequently, in one embodiment, processed portions of the wafer 108 would expand from a center region to the edge region of the wafer 108 in a spiral movement as the processing operation progresses. In another embodiment, when the proximity heads 106a and 106b are moved from the periphery of the wafer 108 to the center of the wafer 108, the processed portions of the wafer 108 would expand from the edge region of the wafer 108 to the center region of the wafer 108 in a spiral movement.

In an exemplary processing operation, it should be understood that the proximity heads 106a and 106b may be configured to dry, clean, etch, and/or plate the wafer 108. In an exemplary drying embodiment, the at least one of first inlet may be configured to input deionized water (DIW) (also known as a DIW inlet), the at least one of a second inlet may be configured to input $N_2$ carrier gas containing isopropyl alcohol (IPA) in vapor form (also known as IPA inlet), and the at least one outlet may be configured to remove fluids from a region between the wafer and a particular proximity head by applying vacuum (also known as vacuum outlet). It should be appreciated that although IPA vapor is used in some of the exemplary embodiments, any other type of vapor may be utilized such as for example, nitrogen, any suitable alcohol vapor, organic compounds, volatile chemicals, etc. that may be miscible with water.

In an exemplary cleaning embodiment, a cleaning solution may be substituted for the DIW. An exemplary etching embodiment may be conducted where an etchant may be substituted for the DIW. In an additional embodiment, plating may be accomplished as described in further detail in reference to U.S. patent application Ser. No. 10/607,611 filed on Jun. 27, 2003 entitled "Apparatus and Method for Depositing and Planarizing Thin Films of Semiconductor Wafers" which was incorporated by reference above. In addition, other types of solutions may be inputted into the first inlet and the second inlet depending on the processing operation desired.

It should be appreciated that the inlets and outlets located on a face of the proximity head may be in any suitable configuration as long as a stable meniscus as described herein may be utilized. In one embodiment, the at least one $N_2$/IPA vapor inlet may be adjacent to the at least one vacuum outlet which is in turn adjacent to the at least one processing fluid inlet to form an IPA-vacuum-processing fluid orientation. It should be appreciated that other types of orientations such as IPA-processing fluid-vacuum, processing fluid-vacuum-IPA, vacuum-IPA-processing fluid, etc. may be utilized depending on the wafer processes desired and what type of wafer processing mechanism is sought to be enhanced. In a preferable embodiment, the IPA-vacuum-processing fluid orientation may be utilized to intelligently and powerfully generate, control, and move the meniscus located between a proximity head and a wafer to process wafers. The processing fluid inlets, the $N_2$/IPA vapor inlets, and the vacuum outlets may be arranged in any suitable manner if the above orientation is maintained. For example, in addition to the $N_2$/IPA vapor inlet, the vacuum outlet, and the processing fluid inlet, in an additional embodiment, there may be additional sets of IPA vapor inlets, processing fluid inlets and/or vacuum outlets depending on the configuration of the proximity head desired. It should be appreciated that the exact configuration of the IPA-vacuum-processing fluid orientation may be varied depending on the application. For example, the distance between the IPA input, vacuum, and processing fluid input locations may be varied so the distances are consistent or so the distances are inconsistent. In addition, the distances between the IPA input, vacuum, and processing fluid output may differ in magnitude depending on the size, shape, and configuration of the proximity head 106a and the desired size of a process meniscus (i.e., meniscus shape and size). In addition, exemplary IPA-vacuum-processing fluid orientation may be found as described in the United States Patent Applications referenced above.

In one embodiment, the proximity heads 106a and 106b may be positioned in close proximity to a top surface and a bottom surface respectively of the wafer 108 and may utilize the IPA and DIW inlets and a vacuum outlet(s) to generate wafer processing meniscuses in contact with the wafer 108 which are capable of processing the top surface and the bottom surface of the wafer 108. The wafer processing meniscus may be generated in accordance with the descriptions in reference to Applications referenced and incorporated by reference above. At substantially the same time the IPA and the processing fluid is inputted, a vacuum may be applied in close proximity to the wafer surface to remove the IPA vapor, the processing fluid, and/or the fluids that may be on the wafer surface. It should be appreciated that although IPA is utilized in the exemplary embodiment, any other suitable type of vapor may be utilized such as for example, nitrogen, any suitable alcohol vapor, organic compounds, hexanol, ethyl glycol, acetone, etc. that may be miscible with water. It should be appreciated that any suitable alcohol vapor may contain any suitable types of alcohols. It should be appreciated that the any suitable alcohol can be any suitable carbon-based chemical with a hydroxy group attached to a saturated carbon atom. These fluids may also be known as surface tension reducing fluids. The portion of the processing fluid that is in the region between the proximity head and the wafer is the meniscus. It should be appreciated that as used herein, the term "output" can refer to the removal of fluid from a region between the wafer 108 and a particular proximity head, and the term "input" can be the introduction of fluid to the region between the wafer 108 and the particular proximity head.

FIG. 3 illustrates a proximity head 106 performing a wafer processing operation in accordance with one embodiment of the present invention. The proximity head 106, in one embodiment, moves while in close proximity to a top surface 108a of the wafer 108 to conduct a wafer processing operation. It should be appreciated that the proximity head 106 may also be utilized to process (e.g., clean, dry, plate, etch, etc.) a bottom surface 108b of the wafer 108. In one embodiment, the wafer 108 is rotating so the proximity head 106 may be moved in a linear fashion along the head motion while the top surface 108a is being processed. By applying the IPA 310 through the inlet 302, the vacuum 312 through outlet 304, and the processing fluid 314 through the inlet 306, the meniscus 116 may be generated. It should be appreciated that the orientation of the inlets/outlets as shown in FIG. 3 is only exemplary in nature, and that any suitable inlets/outlets orientation that may produce a stable fluid meniscus may be utilized such as those configurations as described in the United States Patent Applications incorporated by reference previously.

Figure 4A:
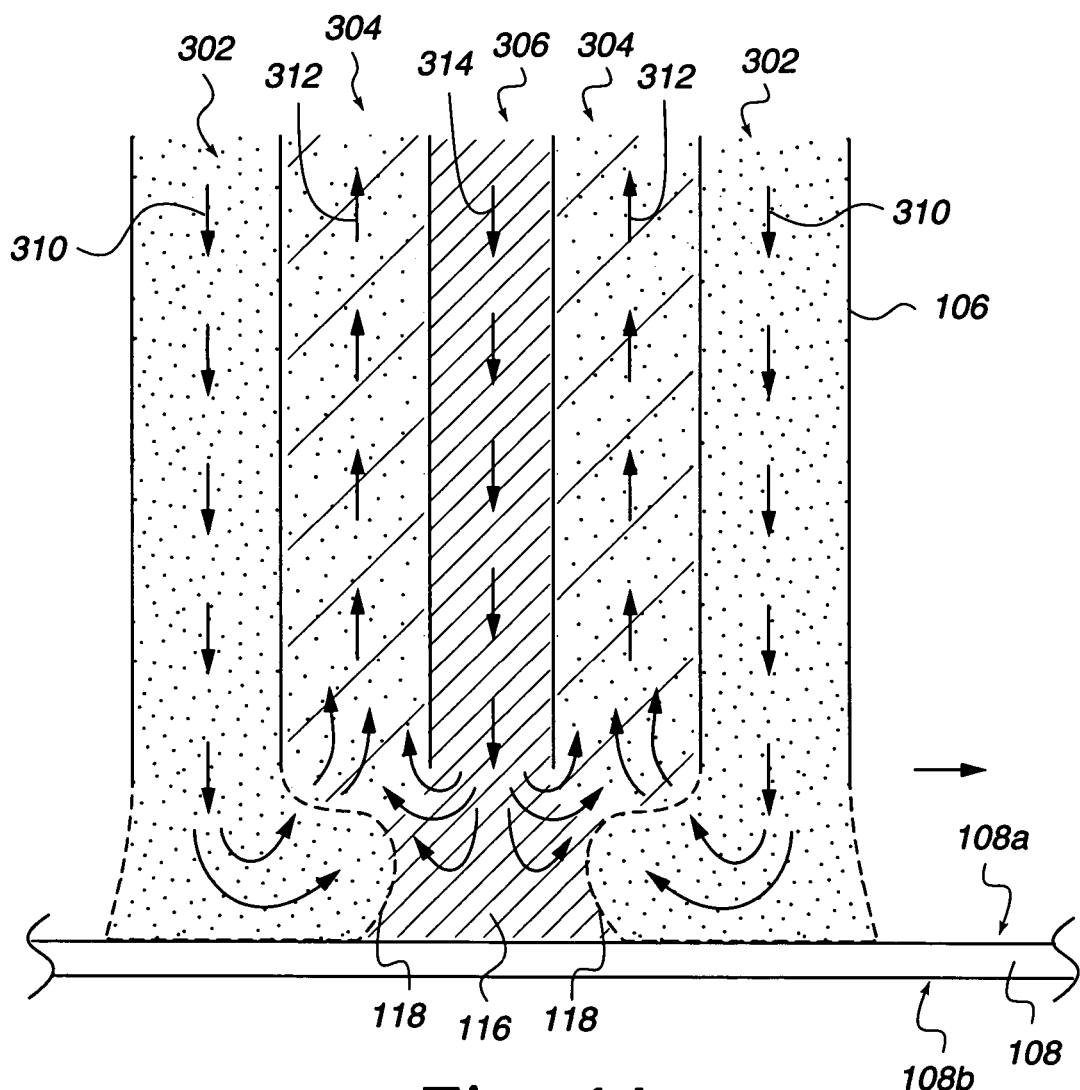
FIG. 4A illustrates a wafer processing operation that may be conducted by a proximity head in accordance with one embodiment of the present invention.

FIG. 4A illustrates a wafer processing operation that may be conducted by a proximity head 106a in accordance with one embodiment of the present invention. Although FIG. 4A shows a top surface 108a being processed, it should be appreciated that the wafer processing may be accomplished in substantially the same way for the bottom surface 108b of the wafer 108. In one embodiment, the inlet 302 may be utilized to apply isopropyl alcohol (IPA) vapor toward a top surface 108a of the wafer 108, and the inlet 306 may be utilized to apply a processing fluid toward the top surface 108a of the wafer 108. In addition, the outlet 304 may be utilized to apply vacuum to a region in close proximity to the wafer surface to remove fluid or vapor that may be located on or near the top surface 108a. As described above, it should be appreciated that any suitable combination of inlets and outlets may be utilized as long as the meniscus 116 may be formed. The IPA may be in any suitable form such as, for example, IPA vapor where IPA in vapor form is inputted through use of a $N_2$ gas. Moreover, any suitable fluid used for processing the wafer (e.g., cleaning fluid, drying fluid, etching fluid, plating fluid, etc.) may be utilized that may enable or enhance the wafer processing. In one embodiment, an IPA inflow 310 is provided through the inlet 302, a vacuum 312 may be applied through the outlet 304 and processing fluid inflow 314 may be provided through the inlet 306. Consequently, if a fluid film resides on the wafer 108, a first fluid pressure may be applied to the wafer surface by the IPA inflow 310, a second fluid pressure may be applied to the wafer surface by the processing fluid inflow 314, and a third fluid pressure may be applied by the vacuum 312 to remove the processing fluid, IPA and the fluid film on the wafer surface.

Therefore, in one embodiment of a wafer processing, as the processing fluid inflow 314 and the IPA inflow 310 is applied toward a wafer surface, fluid (if any) on the wafer surface is intermixed with the processing inflow 314. At this time, the processing fluid inflow 314 that is applied toward the wafer surface encounters the IPA inflow 310. The IPA forms an interface 118 (also known as an IPA/processing fluid interface 118) with the processing fluid inflow 314 and along with the vacuum 312 assists in the removal of the processing fluid inflow 314 along with any other fluid from the surface of the wafer 108. In one embodiment, the IPA/processing fluid interface 118 reduces the surface of tension of the processing fluid. In operation, the processing fluid is applied toward the wafer surface and almost immediately removed along with fluid on the wafer surface by the vacuum applied by the outlet 304. The processing that is applied toward the wafer surface and for a moment resides in the region between a proximity head and the wafer surface along with any fluid on the wafer surface forms a meniscus 116 where the borders of the meniscus 116 are the IPA/processing fluid interfaces 118. Therefore, the meniscus 116 is a constant flow of fluid being applied toward the surface and being removed at substantially the same time with any fluid on the wafer surface. The nearly immediate removal of the processing fluid from the wafer surface prevents the formation of fluid droplets on the region of the wafer surface being dried thereby reducing the possibility of contamination on the wafer 108 after the processing fluid has accomplished its purpose depending on the operation (e.g., etching, cleaning, drying, plating, etc.). The pressure (which is caused by the flow rate of the IPA) of the downward injection of IPA also helps contain the meniscus 116.

The flow rate of the N2 carrier gas containing the IPA may assist in causing a shift or a push of processing fluid flow out of the region between the proximity head and the wafer surface and into the outlets 304 (vacuum outlets) through which the fluids may be outputted from the proximity head. It is noted that the push of processing fluid flow is not a process requirement but can be used to optimize meniscus boundary control. Therefore, as the IPA and the processing fluid is pulled into the outlets 304, the boundary making up the IPA/processing fluid interface 118 is not a continuous boundary because gas (e.g., air) is being pulled into the outlets 304 along with the fluids. In one embodiment, as the vacuum from the outlets 304 pulls the processing fluid, IPA, and the fluid on the wafer surface, the flow into the outlets 304 is discontinuous. This flow discontinuity is analogous to fluid and gas being pulled up through a straw when a vacuum is exerted on combination of fluid and gas. Consequently, as the proximity head 106a moves, the meniscus moves along with the proximity head, and the region previously occupied by the meniscus has been dried due to the movement of the IPA/processing fluid interface 118. It should also be understood that the any suitable number of inlets 302, outlets 304 and inlets 306 may be utilized depending on the configuration of the apparatus and the meniscus size and shape desired. In another embodiment, the liquid flow rates and the vacuum flow rates are such that the total liquid flow into the vacuum outlet is continuous, so no gas flows into the vacuum outlet.

It should be appreciated any suitable flow rate may be utilized for the $N_2$/IPA, processing fluid, and vacuum as long as the meniscus 116 can be maintained. In one embodiment, the flow rate of the processing fluid through a set of the inlets 306 is between about 25 ml per minute to about 3,000 ml per minute. In a preferable embodiment, the flow rate of the processing fluid through the set of the inlets 306 is about 800 ml per minute. It should be understood that the flow rate of fluids may vary depending on the size of the proximity head. In one embodiment a larger head may have a greater rate of fluid flow than smaller proximity heads. This may occur because larger proximity heads, in one embodiment, have more inlets 302 and 306 and outlets 304.

In one embodiment, the flow rate of the $N_2$/IPA vapor through a set of the inlets 302 is between about 1 liters per minute (SLPM) to about 100 SLPM. In a preferable embodiment, the IPA flow rate is between about 6 and 20 SLPM.

In one embodiment, the flow rate for the vacuum through a set of the outlets 304 is between about 10 standard cubic feet per hour (SCFH) to about 1250 SCFH. In a preferable embodiment, the flow rate for a vacuum though the set of the outlets 304 is about 350 SCFH. In an exemplary embodiment, a flow meter may be utilized to measure the flow rate of the $N_2$/IPA, processing fluid, and the vacuum.

It should be appreciated that any suitable type of wafer processing operation may be conducted using the meniscus depending on the processing fluid utilized. For example, a cleaning fluid such as, for example, SC-1, SC-2, etc., may be used for the processing fluid to generate wafer cleaning operation. In a similar fashion, different fluids may be utilized and similar inlet and outlet configurations may be utilized so the wafer processing meniscus may also etch and/or plate the wafer. In one embodiment, etching fluids such as, for example, HF, EKC proprietary solution, KOH etc., may be utilized to etch the wafer. In another embodiment, plating fluids such as, for example, Cu Sulfate, Au Chloride, Ag Sulfate, etc. in conjunction with electrical input may be conducted.

FIG. 4B illustrates a side view of exemplary proximity heads 106 and 106b for use in a dual wafer surface processing system in accordance with one embodiment of the present invention. In this embodiment, by usage of inlets 302 and 306 to input $N_2$/IPA and processing respectively along with the outlet 304 to provide a vacuum, the meniscus 116 may be generated. In addition, on the side of the inlet 306 opposite that of the inlet 302, there may be a outlet 304 to remove processing fluid and to keep the meniscus 116 intact. As discussed above, in one embodiment, the inlets 302 and 306 may be utilized for IPA inflow 310 and processing fluid inflow 314 respectively while the outlet 304 may be utilized to apply vacuum 312. In addition, in yet more embodiments, the proximity heads 106 and 106b may be of a configuration as shown in the United States Patent Applications referenced above. Any suitable surface coming into contact with the meniscus 116 such as, for example, wafer surfaces 108a and 108b of the wafer 108 may be processed by the movement of the meniscus 116 into and away from the surface.

FIGS. 5 through 8 shows a multi-module proximity head that may have multiple modules (or pieces) that make up the head. In one exemplary embodiment, the multi-module proximity head may have an interchangeable piece called a process configuration insert. By removing the process configuration and inserting another process configuration insert with different patterns of inlets and outlet, the meniscus configuration generated by the proximity head may be changed and adjusted for the wafer processing operation desired. Consequently, in one embodiment, depending on the wafer process desired, different types of process configuration modules may be used for different processing operations while utilizing the same housing module which houses the process configuration insert. Therefore, a single wafer processing system may generate different types of meniscuses for different wafer processing operations by using one particular process configuration insert for one operation and then installing a different process configuration insert for another operation.

Figure 5:
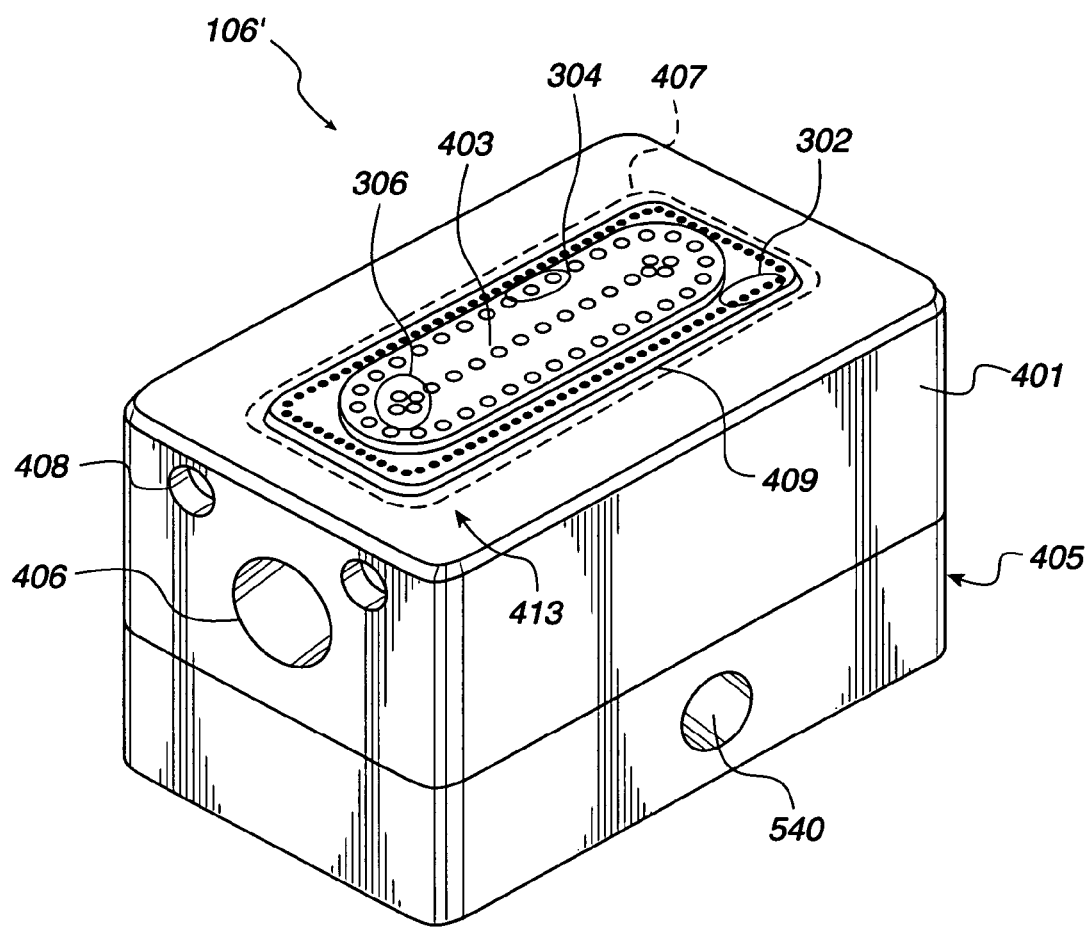
FIG. 5 illustrates a multi-module proximity head in accordance with one embodiment of the present invention.

FIG. 5 illustrates a multi-module proximity head 106' in accordance with one embodiment of the present invention. In one embodiment, the multi-module proximity head 106' includes a housing module 401, a process configuration insert 403, and a cover module 405. The housing module 401, the process configuration insert 403, and the cover module 405 may be any suitable material that is compatible with processing fluids such as, for example, plastics, metals, polymers, polyethylene terephthalate (PET), polyvinylidene flouride (PVDF), polyetherether ketone (PEEK), etc. In one embodiment, the housing module 401, the process configuration insert 403, and the cover module are machined out of PVDF. It should be appreciated that the housing module 401, the process configuration insert 403, and the cover module 405 may be each be made from one material or alternatively, may be made from different materials.

The housing module 401 may be configured so an insert surface (which includes at least one of an inlet 302, 306, and an outlet 304 located on the process configuration insert 403) of the process configuration insert 403 may be inserted into the housing module 401 to generate a proximity face 407 where inlets 302 and 306 as well as outlets 304 are located. The housing module 401 is described in further detail in reference to FIG. 6A while the process configuration insert 403 and the insert surface is described in further detail in reference to FIG. 6B.

In one embodiment, as described below, the housing module 401 may be configured to have at least one inlet (such as, for example, inlet 302) which can apply IPA/$N_2$ vapor to the surface of the wafer 108. When the housing module 401 includes the inlet 302, the process configuration insert 403 may include an inlet such as, for example, inlet 306 that can apply a processing fluid and an outlet such as, for example, outlet 304 that can remove the IPA/$N_2$ and the processing fluid from the surface of the wafer 108. In yet another embodiment, the housing module 401 does not contain any inlets and outlets while the process configuration insert 403 may include inlets 302 and 306 as well as outlets 304.

Therefore, depending on the configuration of the housing 401, the process configuration insert 403 alone may have the inlets/outlets necessary to generate a dynamic fluid meniscus while in other embodiments, some of the inlets/outlets may be located in the housing 401 while other inlets/outlets are located in the process configuration insert 403. As a result, the housing 401 and the process configuration insert 403 may be configured in any suitable manner where the combination of the housing 401 and the insert 403 can generate a dynamic fluid meniscus. In addition, the process configuration insert 403 and the housing 401 may be configured so that the process configuration insert 403 may be replaced with another process configuration insert with an different inlet/outlet pattern to generate a different shaped and/or sized meniscus.

Therefore, in one embodiment, the process configuration insert 403 may be interchanged with another process configuration insert with a different inlet/outlet configuration in circumstances when a different meniscus configuration is desired. In such a fashion, depending on the process (e.g., cleaning, drying, etching, plating, etc.), a particular process configuration insert with particular inlet/outlet configurations may be utilized. Consequently, in one embodiment, only the process configuration insert 403 needs to be change in the manifold 106' when a different meniscus configuration is desired. As a result, the multi-module manifold 106' may be easily reconfigured to generate a different meniscus configuration by changing the process configuration insert 403.

The cover module 405 may be attached to both the process configuration insert 403 and the housing 401 to form the multi-module proximity head 106'. In one embodiment, the cover module may have a port 540 for inputting the processing fluid into the multi-module manifold 106'. The cover module 405 may also include attachment openings that may extend through the cover module 405 so an attachment device such as, for example, a bolt, a screw, etc. may be inserted into the cover module 405 and into the housing module 401 (or into the process configuration insert 403 depending on the attachment opening) to enclose the process configuration insert 403 inside the multi-module proximity head 106'. It should be appreciated that the attachment openings may be created in any suitable fashion such as, for example, drilling, machining, etc. The cover module 405 is described in further detail in reference to FIG. 6C.

In one particular embodiment, the multi-module proximity head 106' may include at least one of the inlets 302 and at least one of the inlets 306 and at least one of the outlets 304. In one embodiment, as described above, the one inlet 302 may input IPA/N$_2$ into a region between the multi-module proximity head 106' and a surface of a substrate such as, for example, the wafer 108 as described above. Also as described above, it should be appreciated that other types of fluids may be inputted through the inlets 302 such as, for example, other volatile fluids in vapor form including that may be miscible with aqueous fluids that can decrease the surface tension of the aqueous fluid.

In one embodiment, the inlets 306 may input one or more of various fluids depending on the process for which the multi-module proximity head is used. In an embodiment where the multi-module proximity head 106' is utilized for drying, DIW may be inputted through the inlets 306 to the region between the multi-module proximity head 106 and a substrate such as, for example, the wafer 108. In another embodiment, for a cleaning operation, a cleaning fluid such as, for example, SC-1, SC-2, etc. may be inputted through the inlets 306 to the region between the multi-module proximity head 106 and a substrate such as, for example, the wafer 108. In yet another embodiment, for an etching operation, an etching fluid such as, for example, HF, etc., may be inputted through the inlets 306 to the region between the multi-module proximity head 106 and a substrate such as, for example, the wafer 108. In another embodiment, for a plating operation, a plating fluid may be inputted through the inlets 306 to the region between the multi-module proximity head 106' and a substrate such as, for example, the wafer 108. Therefore, by changing the process configuration insert and/or changing the process fluid, the multi-module proximity head 106' may be utilized to perform any suitable wafer processing operation(s) where processing fluid control is desired.

In one embodiment, a portion of the multi-module proximity head 106' may preferably have the proximity face 407 as a raised region 409 where the inlets 302 and 306 as well as outlets 304 are located. It should be appreciated that the raised region 409 may be raised any suitable amount of height from a surrounding surface 413 as long as the meniscus generated within the raised region 409 does not attach to the surrounding surface 413 through surface tension. In one embodiment, by having the region with the inlets 302 and 306 and outlets 304 being raised, the meniscus may be made more manageable. This increased manageability may occur because the surface of the multi-module proximity head 106' without the inlets and outlets may be located farther away from the surface area of the multi-module proximity head 106' with the inlets and outlets. Therefore, the surface of the multi-module proximity head 106' surrounding the meniscus is less accessible to surface tension attachment by the meniscus.

In yet another embodiment, the location of the raised region 409 of the multi-module proximity head 106' may, instead of being raised, be indented so the region with the inlets and outlets may be located farther away from the wafer surface than the surrounding surface of the multi-module proximity head 106'. In such an embodiment, the inlets 302 may not be necessary to generate a fluid meniscus because the meniscus is held within the indented portion.

In addition, the assembly method described herein enables usage of dissimilar materials for each component, or other material(s) that cannot be bonded or fused to form the final assembly. In one embodiment, multiple components may have attachments openings enabling the bolting of dissimilar materials. The method permits a wider selection of chemically compatible materials to be utilized to meet process desires. In addition, the method enables individual components to be replaced with alternate configurations. This may optimize the flow and delivery characteristics to the process desires.

Figure 6A:
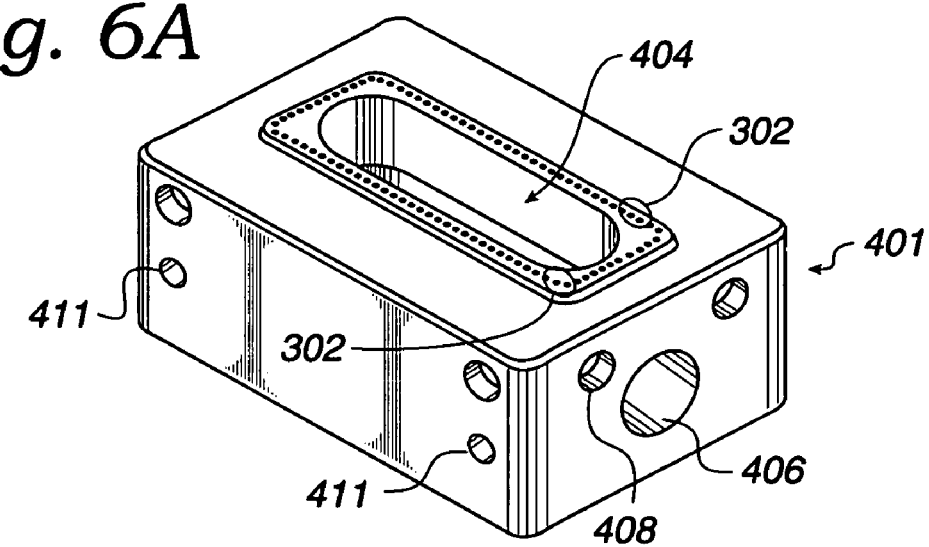
FIG. 6A illustrates a housing module in accordance with one embodiment of the present invention.

FIG. 6A illustrates a housing module 401 in accordance with one embodiment of the present invention. It should be appreciated that the housing module 401 may be any suitable configuration that would enable the process configuration insert 403 to be inserted into the housing module 401. In one embodiment, the housing module has a first end and a second end where an opening exists in the first surface of the first and the second surface of the second end. The housing module may also have an internal opening connecting to the openings in the first surface and the second surface. In such an embodiment, the process configuration insert 403 may be defined in the internal opening such that the insert surface resides in the opening of the first surface. Although exemplary configurations of the housing module 401 are shown, it should be appreciated the configuration of the housing module 401 may differ depending on the configuration of the process configuration insert 403. For example, if the process configuration insert 403 was square in configuration, the passage in the housing module 401 may be square so as to accommodate the process configuration insert 403.

In one embodiment, the housing module 401 may have an opening in one side and an opening on the opposite side with a passage there between. In one embodiment, the housing module 401 includes at least one inlet 302. Therefore, in such a configuration, as described above, the at least one inlet 302 can input IPA/N$_2$ vapor or any other suitable type of vapor to assist in the generation of a meniscus interface between the fluid and the atmosphere in the processing environment.

The housing module 401 may also include an input 411 into which the fluid to be transmitted to the at least one inlet 302 may be inputted. It should be appreciated that the housing module 401 may be configured in any suitable fashion that may enable transportation of fluid from the input 411 to the at least one inlet 302. In one embodiment, a passage may be machined within the housing module 401 connecting the input 411 and the at least one inlet 302. The housing module 401 may also include an opening 404 which is configured to receive an insert surface of the process configuration insert.

Figure 6B:
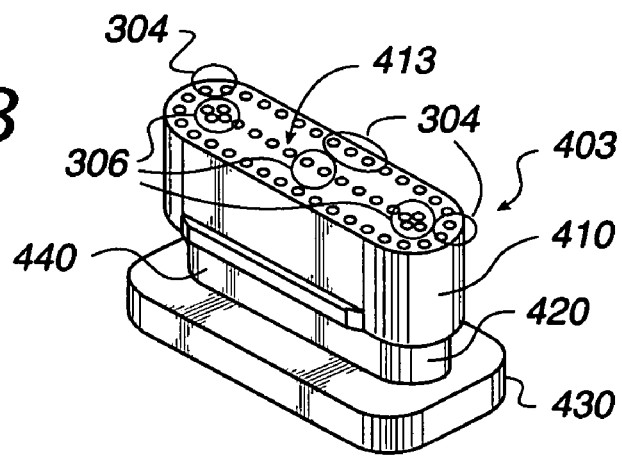
FIG. 6B illustrates a process configuration insert in accordance with one embodiment of the present invention.

FIG. 6B illustrates a process configuration insert 403 in accordance with one embodiment of the present invention. It should be appreciated that the process configuration insert 403 may have any suitable configuration of inlets and outlets so when combined with the housing 401, the fluid meniscus may be generated. In one embodiment, the process configuration insert 403 includes at least one inlet 306 and at least one outlet 304. The process configuration insert 403 may also include a ridge 440 which can prevent the process configuration insert 403 from being inserted too far into the housing module 401. The process configuration insert 403 may also include an indented portion 420. The indented portion 420 may exist to generate an insert portion 410 which is larger in circumference than the indented portion 420. The process configuration insert 403 may also include a base 430 which is a portion of the process configuration insert 403 below the indented portion 420. The insert portion 410 may include the at least one inlet 306 and the at least one outlet 304 on an insert surface 413. In one embodiment, the outlet 304 may be connected to passage(s) defined within the process configuration insert that extend from one end of the portion 410 to another end of the insert portion 410 so fluid may pass from one side of the insert portion 410 to the other side. The inlet 306 may be connected to passage(s) defined within the process configuration insert 403 extending from insert surface 413 to an opening in the base 430. Therefore, fluid to be expelled by the at least one inlet 306 may be received from the opening in the base 430 and be transmitted through passage(s) inside the process configuration insert 403 to reach the at least one inlet 306. The base 430 may include opening(s)/passage(s) through which fluids may be pass to and from the cover module 405.

Figure 6C:
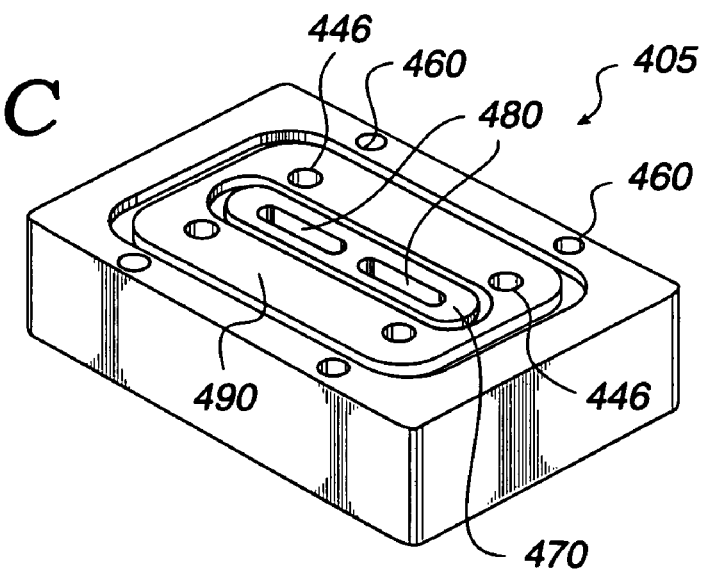
FIG. 6C illustrates a cover module in accordance with one embodiment of the present invention.

FIG. 6C illustrates a cover module 405 in accordance with one embodiment of the present invention. In one embodiment, the cover module 405 includes O-rings 470 and 490 as well as a fluid passage 480 and attachment openings 460 and 446. The O-ring 470 may be configured to seal the fluid passage 480 (when the cover module 405, process configuration insert 403 and the housing module 401 are combined to form the multi-module proximity head 106') so fluid from the fluid passage 480 does not leak into other areas of the multi-module proximity head 106'. In one embodiment, the O-ring 470 may provide a seal so fluid flows from the passage 480 to a passage 564 (as discussed in reference to FIG. 7B) without leakage of fluid into other regions of the multi-module proximity head 106'. The O-ring 490 may be utilized to seal an internal space 574 (as discussed in reference to FIG. 7C) so fluid within the internal space 574 does not leak out of the multi-module proximity head 106'.

In one embodiment, the attachment openings 460 may be configured to connect the housing 401 with the cover 405. In addition, the attachment openings 460 may be configured so bolts may be used to connect the cover 405 with the process configuration insert 403. It should be appreciated that any suitable type or configuration of attachment openings may be utilized to interconnect the housing 401, the insert 403, and the cover 405.

The attachment openings 446 may be configured to connect the cover 405 with the process configuration insert 403. In addition, as with the attachment openings 460, the attachment openings 446 may be configured so bolts may be used to connect the cover 405 with the process configuration insert 403.

FIG. 7A illustrates a bottom view of a cover module 405 in accordance with one embodiment of the present invention. In one embodiment, the cover module 405 includes attachment openings 530 and 520. The openings 530 may be configured so as to pass through the cover module 405 from one side to another side thereby enabling, in one embodiment, bolts or any other attachment device to connect the cover module 405 with the housing 401. The openings 520 may also be configured so as to pass through the cover module 405 from one side to another side thereby enabling, in one embodiment, bolts or any other attachment device to connect the cover module 405 with the process configuration insert 403. It should be appreciated that any suitable number and/or type of openings may be utilized to connect the different pieces of the multi-module manifold 106'. It should also be understood that holes do not have to be utilized but any suitable way of attaching the different modules may be utilized such as, for example, gluing, welding, etc.

In one embodiment, the cover module 405 also includes an input port 540 through which fluid may be inputted and transported through fluid passage 480 (shown in FIG. 4C). In one embodiment, the cover module 405 may be configured to have a passage defined therewith so fluid from the input port 540 may be transported to the process configuration insert 403 which can then transport the fluid to the at least one inlet 306 on the insert surface.

The cover module 405 may also include attachment openings 510 through which an arm may be connected to the cover module 405 by bolting or any other suitable type of connecting apparatus.

FIG. 7B shows a bottom view of the process configuration insert 403 in accordance with one embodiment of the present invention. In one embodiment, the process configuration insert 403 may include attachment openings 560. The process configuration insert 403 and the cover module 405 may be attached by inputting an attachment device, such as, for example a bolt, through the attachment openings 520 in the cover module 405 to the attachment openings 560 in the process configuration 403.

The process configuration insert 403 may also include a passage 564 which may receive fluid from the passage 480 (as shown in FIG. 6C). In one embodiment the passage 564 may move fluid through the process configuration insert 403 to the inlets 306. Therefore, fluid may travel from the passage 480 to the passage 564 to the inlets 306.

FIG. 7C illustrates a bottom view of a housing module 401 in accordance with one embodiment of the present invention. In one embodiment, the housing module 401 includes an input 406 which may supply at least one inlet 302 with fluid. In one embodiment, passage(s) are defined within the housing module 401 which connect the input 406 and the at least one inlet 302. Therefore, fluid and/or vapor may be inputted into the housing module through the input 406. The fluid can then be transported through the housing module 401 to the at least inlet 302 which may apply the transported fluid into a region between the housing module 401 and the wafer 108 to assist in generating and maintaining a stable fluid meniscus that can be generated through the fluid applied to the wafer 108 from the inlets 302 and 306 and the fluid removed from the wafer 108 through the outlets 304.

In addition, the housing module 401 may include an internal space 574 which may house the process configuration insert 403. In one embodiment the side of the process configuration insert 403 with the insert portion 410 (as shown in FIGS. 7B and 6B) is inputted into the internal opening of the housing module 401. In this fashion, the process configuration insert 403 may be defined within the housing module 401 such that the resulting structure may be capable of forming a fluid meniscus as discussed herein.

Figure 8:
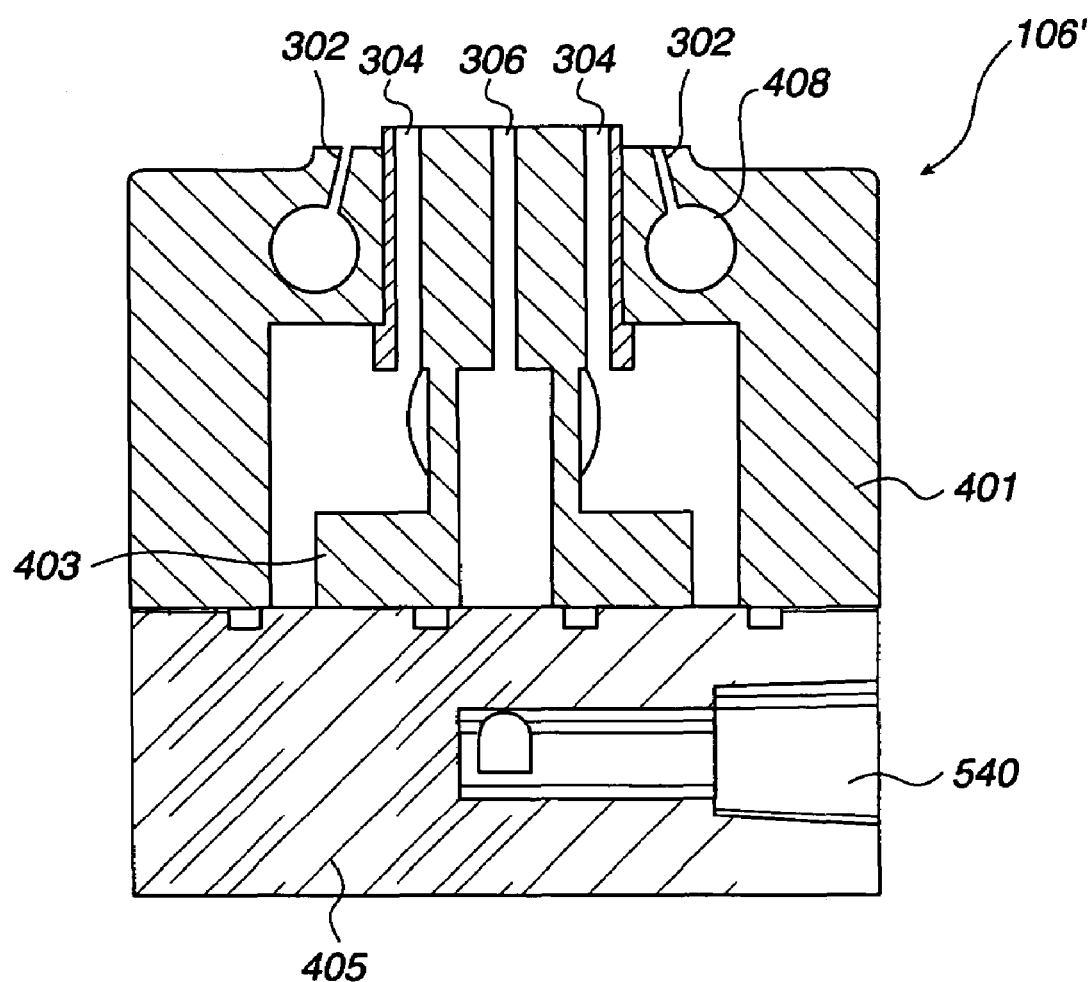
FIG. 8 shows a side view of the multi-module proximity head illustrating fluid passages in accordance with one embodiment of the present invention.

FIG. 8 shows a side view of the multi-module proximity head 106' illustrating fluid passages in accordance with one embodiment of the present invention. In one embodiment, the multi-module proximity head 106' includes the cover module 405 that has a port 540 through which fluid may be transmitted by internal passage(s) to the inlet 306. The multi-module proximity module 106' may include a port 408 which can supply the inlets 302 with IPA/N$_2$. Vacuum may be applied to the outlets 304 to remove fluids from a wafer surface when the multi-module proximity module 106' is in operation.

Figure 9A:
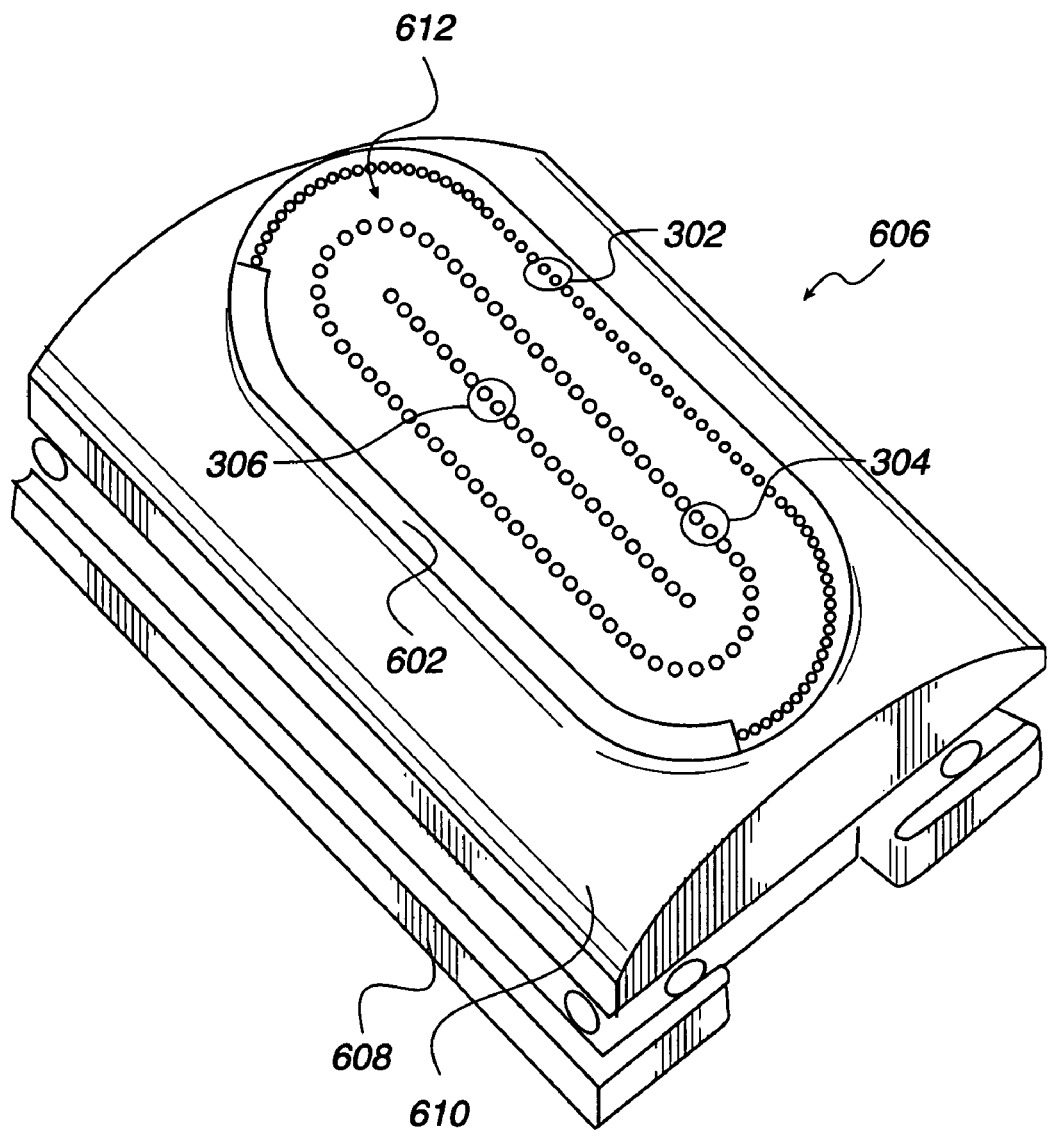
FIG. 9A shows an omni-usage manifold with an interface membrane in accordance with one embodiment of the present invention.

FIG. 9A shows an omni-usage manifold 606 with an interface membrane 602 in accordance with one embodiment of the present invention. It should be appreciated that the omni-usage manifold 606 may also be known as a proximity head with the structures and functionalities as described herein. In one embodiment, the omni-usage manifold 606 may include a manifold head 610 and a manifold cover 608. In one embodiment, the manifold head 610 of the omni-usage manifold 606 (which may also be known as a proximity head) may include a proximity face 612 that has inlets 302 and 306 and outlets 304. The inlets 302 and 306 and the outlets 304 can be of any suitable configuration that produces a certain meniscus configuration. The meniscus that is generated may then be tailored to a particular wafer processing operation because the interface membrane 602 can be attached to any suitable location within the omni-usage manifold 606 to alter fluid flow to and/or from the meniscus.

In one embodiment, the interface membrane 602 may be attached to the omni-usage manifold 606 in such a way that particular ones of the inlets 302 and 306 and outlets 304 do not transport fluids. This control of fluid flow to and from the meniscus by using the interface membrane 602 of a particular size, shape, and/or location can configure the meniscus to a particular size and shape. Therefore, the manifold head 610 can be a "blank" manifold which means one configuration of the manifold head 610 with any suitable type of inlet/outlet configuration may be utilized as long as one or more of the interface membrane 602 can be utilized to manage the meniscus shape/size. In one embodiment, the interface membrane 602 may be a layer of any suitable material that may at least partially block flow of fluid such as, for example, MYLAR or a similar thermoplastic film, engineering plastic, Kapton Tape, etc. The interface membrane 602 may be bonded, welded, or adhered to the manifold head 610 to generate a face of pattern of holes and features determining the shape and size of the process specific "process window" (e.g., meniscus configuration). In one embodiment, the meniscus configuration can then be tested and if a failure occurs or the meniscus configuration is not desired, the interface membrane 602 may be removed and replaced by a different membrane thus saving and reusing the omni-usage manifold 606. This methodology may be repeated until the desired process window/meniscus configuration is achieved.

It should also be understood that the interface membrane 602 may be attached to any suitable location within the omni-usage manifold 606 that can change the configuration of the meniscus formed by the omni-usage manifold 606. Therefore, depending on the desired meniscus usage and desired configuration, one or more membrane interface(s) may be attached in one or more locations within the omni-usage manifold 606 to generate the desired meniscus configuration(s).

In one embodiment, the membrane interface 602 may be located between the manifold head 610 and the manifold cover 608 where fluid passageways to certain inlets/outlets are blocked. In another embodiment, the membrane interface 602 may be attached to the manifold head 610 on a side where the inlets 302 and 306 and outlets 304 are located. In yet another embodiment, one or more membrane interface 602 may be utilized between the manifold head 610 and manifold cover 608 and on the face of the manifold head 610 that includes the inlets 302 and 306 and the outlet 304. In this way, different types of meniscus configurations may be attained while using a single manifold blank.

Figure 9B:
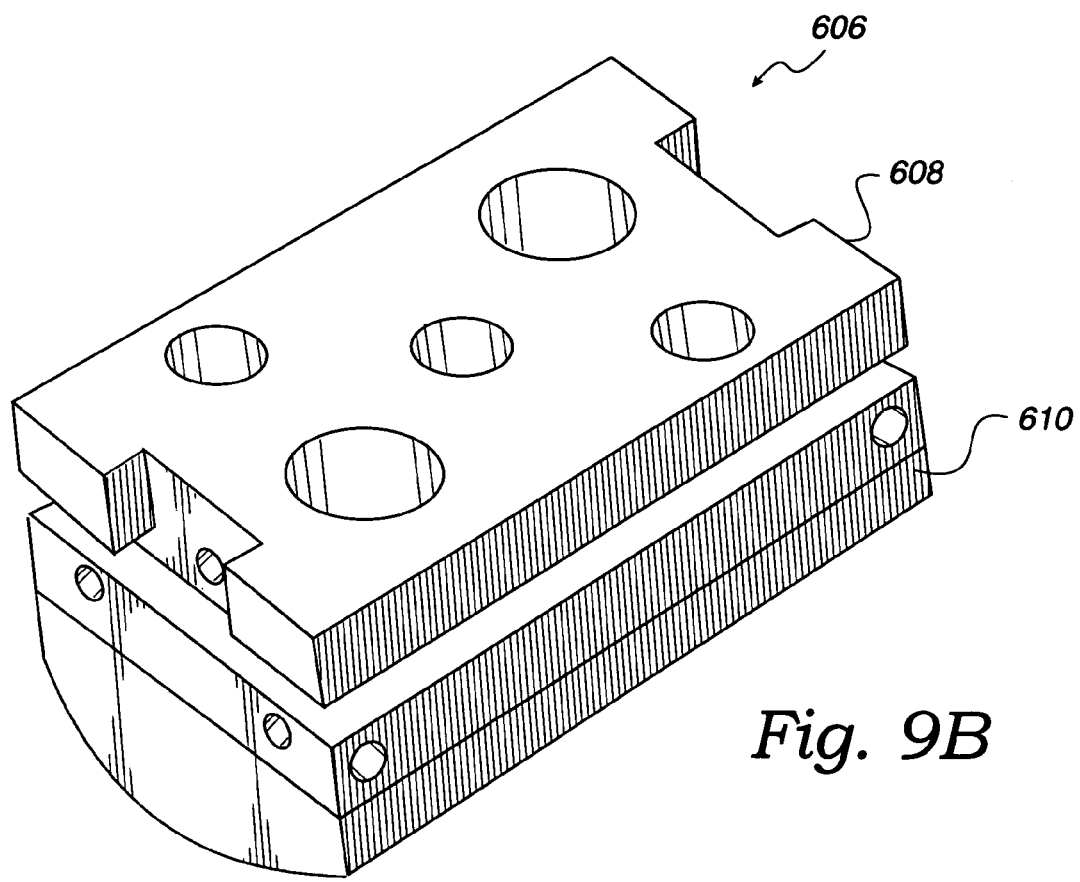
FIG. 9B shows a bottom view of the omni-usage manifold in accordance with one embodiment of the present invention.

FIG. 9B shows a bottom view of the omni-usage manifold 606 in accordance with one embodiment of the present invention. In one embodiment, the omni-usage manifold 606 can be configured to transmit fluid between ports on the manifold cover 608 and the inlets 302 and 306 as well as outlets 304. In addition, the manifold cover 608 may have attachment holes so the omni-usage manifold 606 may be attached by bolts (or any other suitable type of attachment device or method) to any suitable movement apparatus such as, for example, the arm 104 (as shown in FIG. 2). It should be appreciated that the omni-usage manifold 606 may be configured to be attachable to any type of apparatus that can move the omni-usage manifold 606 in close proximity to a substrate so the substrate may be processed by a desired operation (e.g., cleaning, drying, plating, etching, etc.).

Figure 9C:
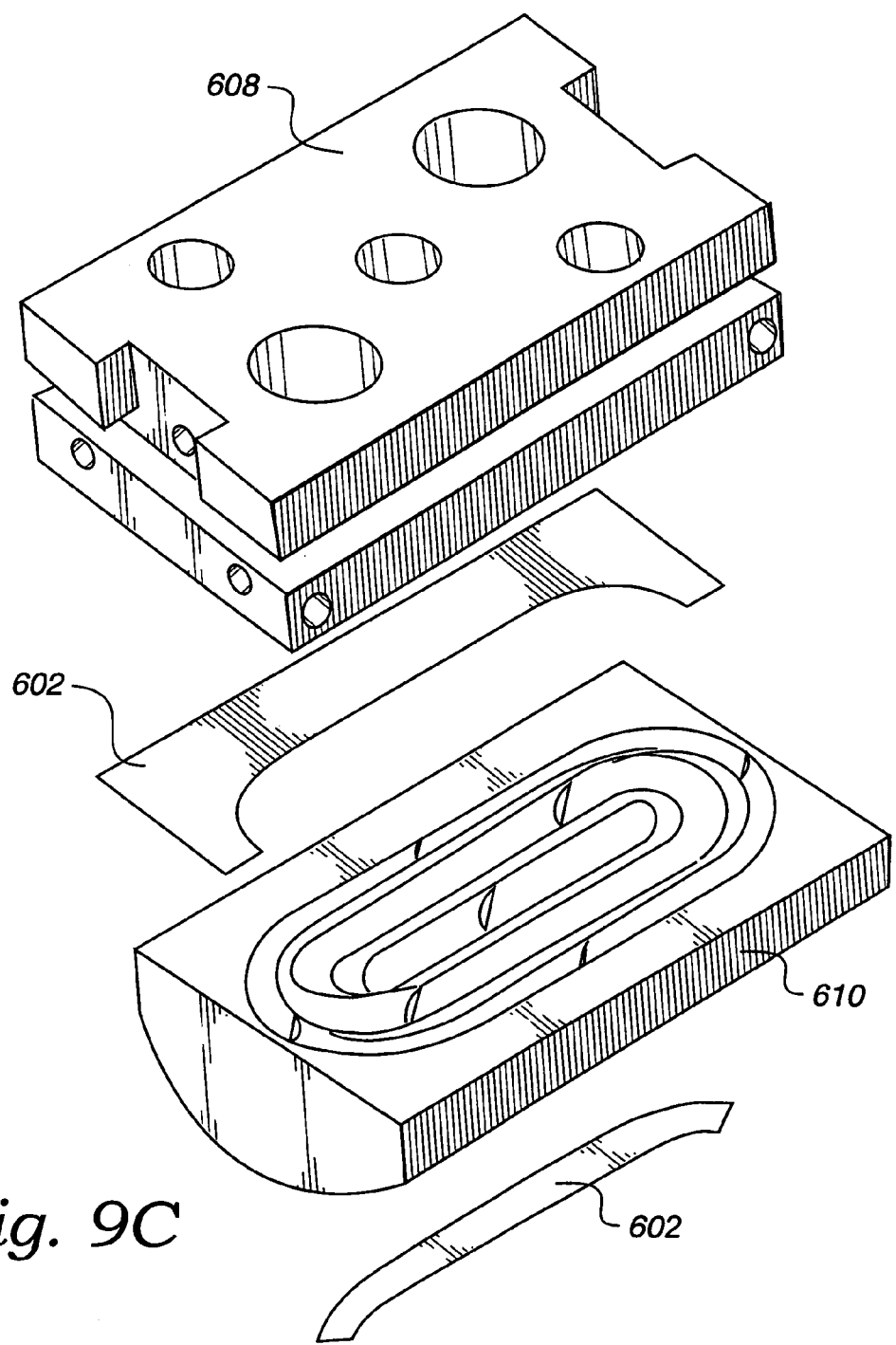
FIG. 9C shows an exploded bottom view of an omni-usage manifold in accordance with one embodiment of the present invention.
Figure 9D:
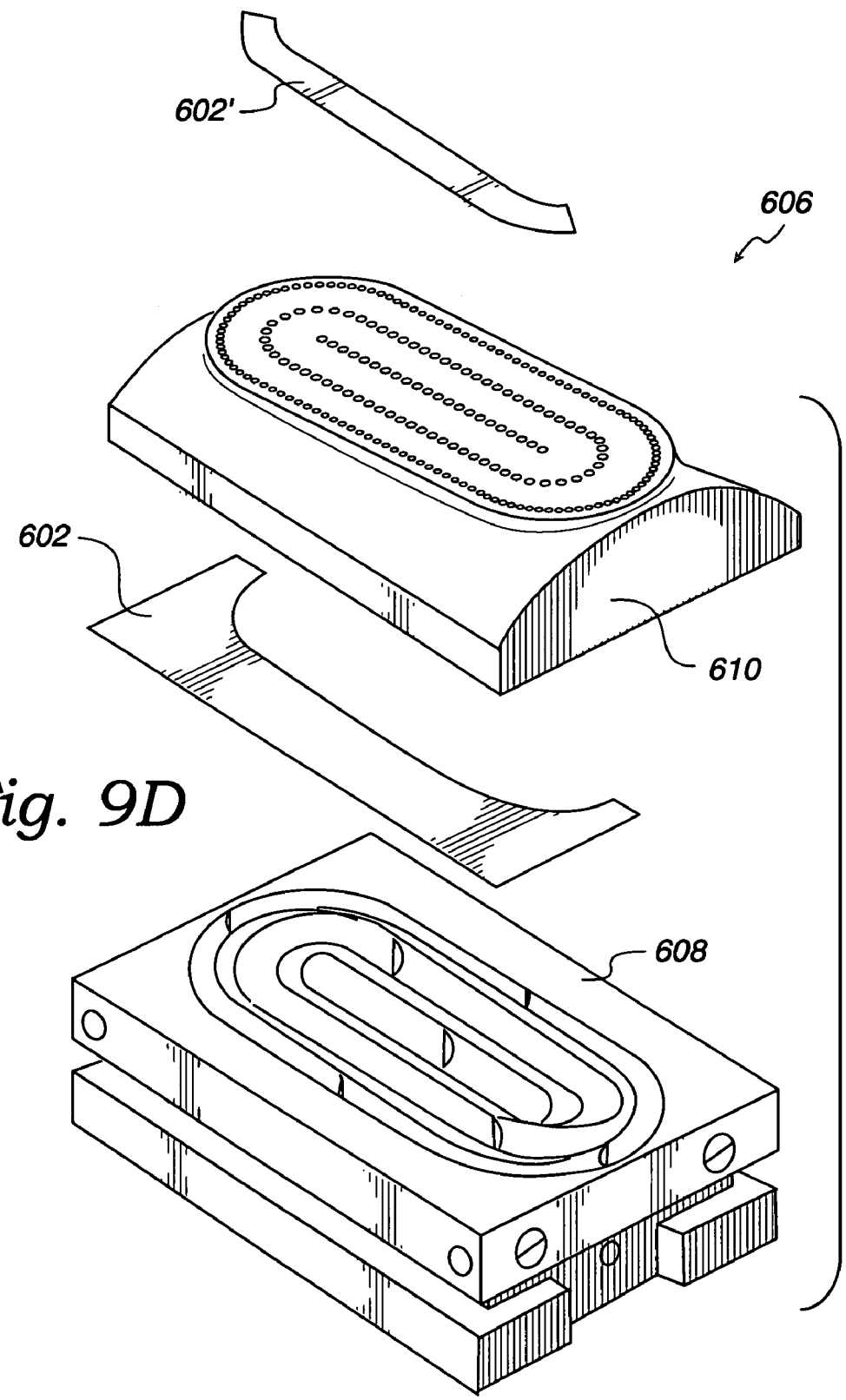
FIG. 9D illustrates an exploded top view of an omni-usage manifold in accordance with one embodiment of the present invention.

FIG. 9C shows an exploded bottom view of an omni-usage manifold 606 in accordance with one embodiment of the present invention. In one embodiment, the omni-usage manifold 606 includes an interface membrane 602' that is located between the manifold cover 608 and the manifold head 610 and the interface membrane 602 located on the proximity face 612 (as shown in FIGS. 9A and 9D). The interface membrane 602 and/or the interface membrane 602' may inhibit fluid flow to the inlets 302 and/or 306 and/or inhibit fluid flow from the outlets 304 on the proximity face 612. Therefore, by inhibiting fluid flow to the inlets 302 and/or 306 and fluid flow from the outlets 304, the meniscus shape/size may be changed in a corresponding region (as compared to the region where the interface membrane 602/602' is/are located) between the proximity face 612 and the substrate/wafer being processed. Consequently, by locating the interface membrane 602 in certain locations, the meniscus configuration may be adjusted to the process desired. It should be appreciated that the interface membrane 602 may be utilized to adjust meniscus configuration in any suitable wafer processing operation such as, for example, etching, cleaning, drying, plating, etc. Therefore, the interface membrane 602 may be used to custom design meniscus sizes and/or shapes depending on the type of wafer processing operation desired. Consequently, interface membrane(s) 602 may be used with a "blank" manifold to generate a particular meniscus design and therefore, time consuming production of new manifolds may be avoided.

FIG. 9D illustrates an exploded top view of an omni-usage manifold 606 in accordance with one embodiment of the present invention. The omni-usage manifold 606 may have any suitable type of interface membrane 602' and/or 602 in any suitable portion of the omni-usage manifold 606 that may be affect the meniscus configuration when the omni-usage manifold 606 is in usage. In one embodiment, by using one or more interface membranes, portions of the meniscus formed by the omni-usage manifold 606 may be removed or prevented from forming. Therefore, one or more portions of the meniscus may be cut out or removed as desired. In another embodiment, the meniscus size may be increased when portions of the inlets 302 and outlets 304 are blocked.

Figure 10A:
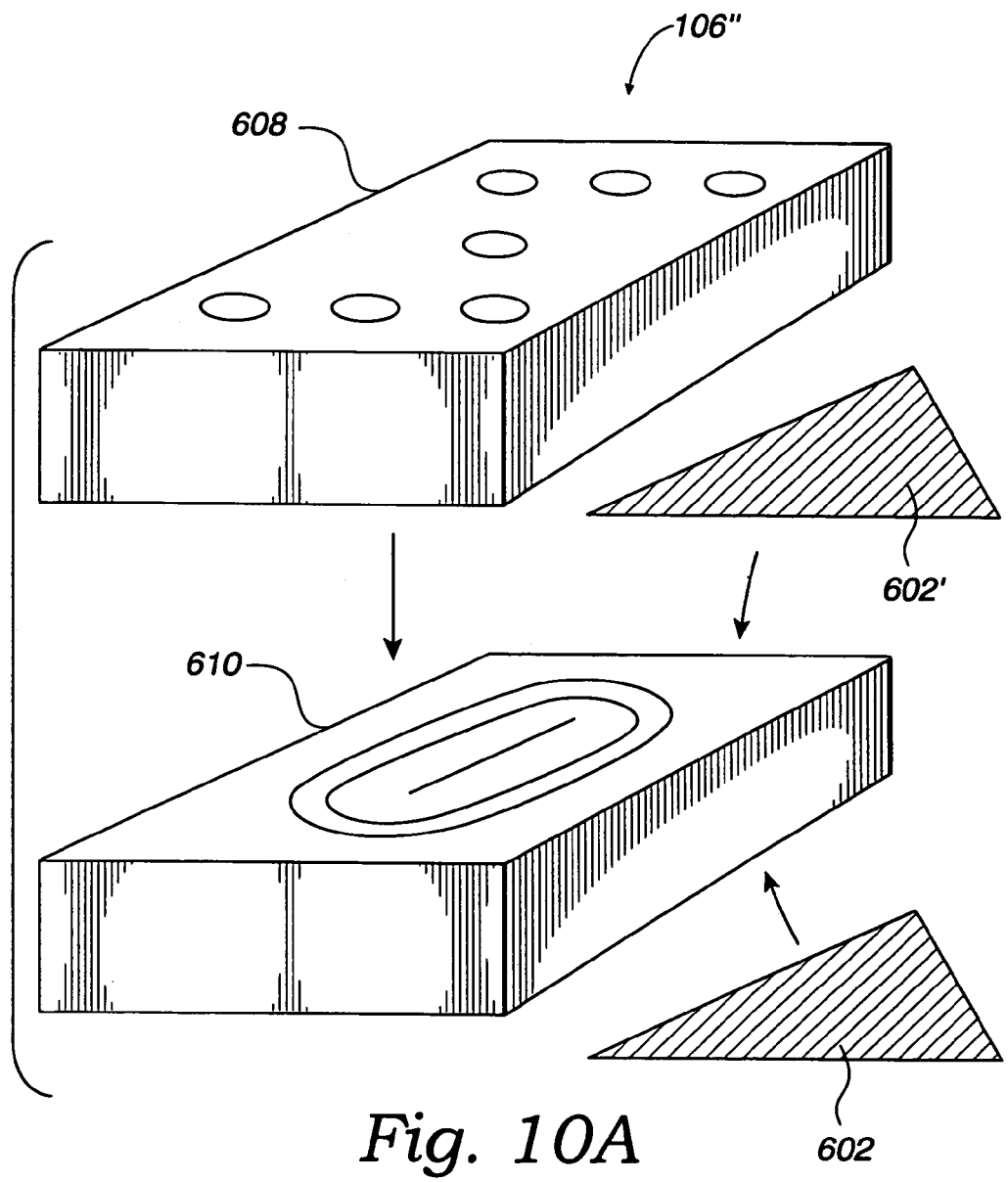
FIG. 10A shows an application of interface membranes to an omni-usage manifold in accordance with one embodiment of the present invention.

FIG. 10A shows an application of interface membranes 602 and/or 602' to an omni-usage manifold 606 in accordance with one embodiment of the present invention. The omni-usage manifold 606 as described herein may be a type of proximity head generated by combining the manifold head 610 and the manifold cover 608. It should be appreciated that the interface membrane 602 and/or 602' may be attached to the omni-usage manifold 606 in any suitable fashion. In one embodiment, the interface membrane 602/602' may be attached to the omni-usage manifold 606 by glue such as, for example, Loctite 380, Loctite 401, Loctite 4210, and Loctite 4212, etc.

In addition, depending on the desired configuration of the meniscus to be formed by the omni-usage manifold 606, any suitable numbers and/or types of interface membrane 602/602' may be utilized. Although the exemplary interface membrane 602/602' as shown are triangular in geometry, it should be appreciated that the interface membrane 602/602' may be any suitable size and/or shape depending the desired shape and size of the meniscus to be generated by the omni-usage manifold 606. Consequently, any suitable meniscus configuration may be generated depending on the size, shape, and location of the interface membrane 602/602'.

It should be understood that the interface membranes 602 and 602' may be any suitable thickness as long as the interface membranes 602 and 602' can at least partially prevent fluid from moving through the portions being blocked. It should be appreciated that the interface membranes 602 and 602' may also be partially permeable thereby decreasing fluid flow through the blocked area.

In one embodiment, the interface membrane 602 is applied to a face of the manifold head 610. The face of the manifold head 610 may have the inlets and outlets for applying and removing fluids from the surface of a substrate. In another embodiment, the interface membrane 602' may be applied to a region in between the manifold 610 and the manifold cover 608. In yet another embodiment, the interface membranes 602 and 602' may be attached to the manifold head 610.

Figure 10B:
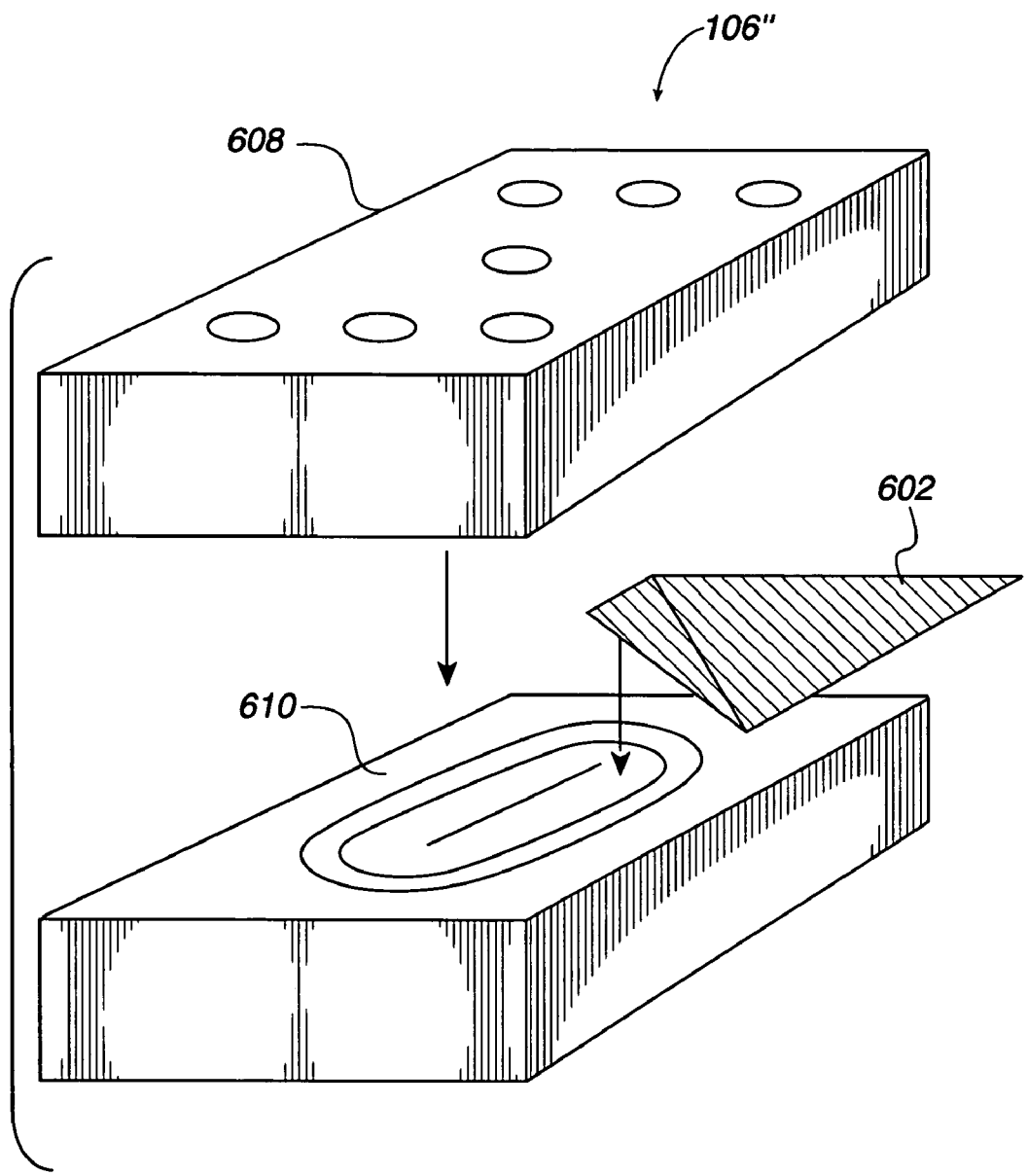
FIG. 10B illustrates an application of an interface membrane between a manifold cover and a manifold head in accordance with one embodiment of the present invention.

FIG. 10B illustrates an application of an interface membrane 602 between a manifold cover 608 and a manifold head 610 in accordance with one embodiment of the present invention. In the embodiment shown in FIG. 10B, the interface membrane 602 may be attached to the manifold head to cover portions of the manifold head 610 where fluid would flow from the manifold cover 608 to the manifold head 610 and where fluid would flow from the manifold head 610 to the manifold cover 608. Therefore, the portions of the fluid passages that supply the fluid to the meniscus and/or remove the fluid from the meniscus are blocked. Therefore, when fluid is cutoff from the meniscus, that portion of the meniscus with reduced fluid may be made smaller. In contrast, when the fluid removal from the meniscus is blocked, meniscus size may be increased. Once the interface membrane 602 has been attached, the manifold head 610 and the manifold cover 608 may be attached to form the omni-usage manifold 606". It should be appreciated that the omni-usage manifold 606" is depicted as two piece apparatus only for exemplary purposes and the omni-usage manifold 606" may include any suitable number of pieces such as, for example, 1, 2, 3, 4, 5, 6, etc. It should also be understood that the interface membrane 602 may be located in any suitable location that may block fluid transport and therefore could be on or between any suitable piece of a multi-piece omni-usage manifold.

Figure 10C:
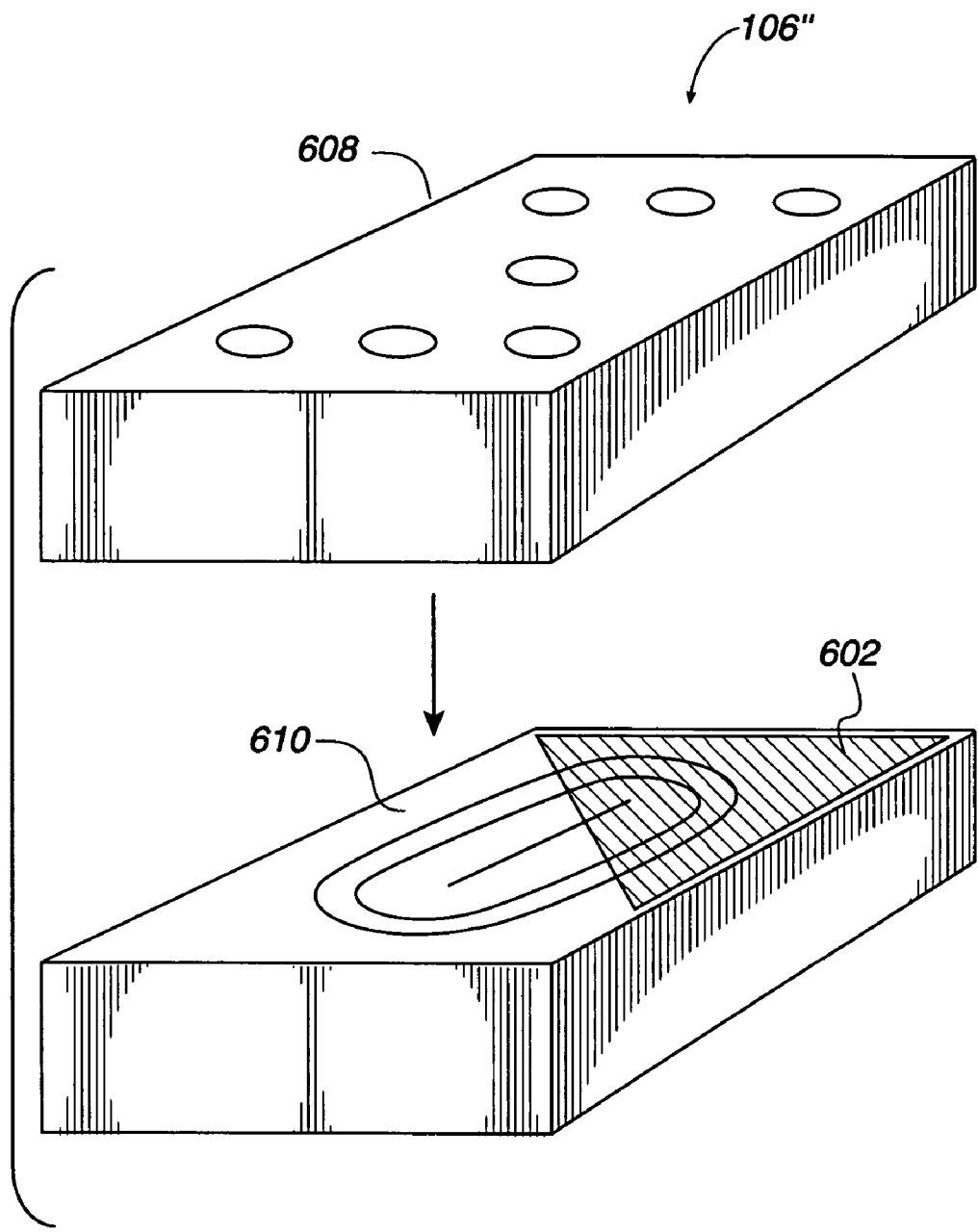
FIG. 10C depicts an interface membrane that has been applied to the manifold head in accordance with one embodiment of the present invention.

FIG. 10C depicts an interface membrane 602 that has been applied to the manifold head 610 in accordance with one embodiment of the present invention. The interface membrane 602 has been attached to the manifold head 610 so that at least a portion of the inlet/outlet that supplies and removes the fluid from the manifold head 610 is blocked. Therefore, the portion(s) of the meniscus that would typically be formed as a result of fluid transportation into the area is eliminated.

It should also be appreciated that the interface membrane 602 may be any suitable thickness as long as the interface membrane 602 can remain intact and prevent fluid from entering the passages that the membrane 602 is covering.

Figure 10D:
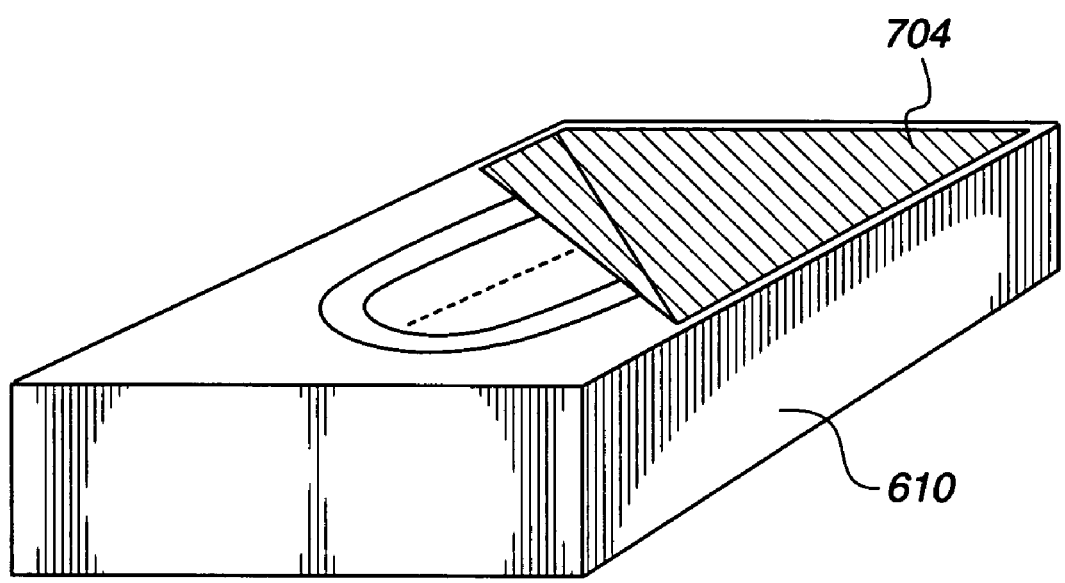
FIG. 10D illustrates an interface membrane applied to a process surface of the manifold head in accordance with one embodiment of the present invention.

FIG. 10D illustrates an interface membrane 602 applied to a process surface of the manifold head 610 in accordance with one embodiment of the present invention. In one embodiment, the interface membrane 602 is attached so at least a portion of the inlets 302 and 306 and outlet 304 located on the process surface is covered. It should be appreciated that the process surface is an area of a surface of the manifold head where the inlets 302 and 306 as well as outlet 304 is located.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. An apparatus for generating a fluid meniscus to be formed on a substrate, comprising:
    a housing having walls and a housing surface with flat regions to be positioned proximate to a surface of the substrate, the housing including a process configuration receiving region that is surrounded by the walls of the housing and the housing surface; and
    a process configuration insert having an insert surface, the process configuration insert being defined to fit within the process configuration receiving region between the walls of the housing such that the insert surface and the housing surface define a proximity face having flat surface regions, the proximity face having a plurality of discrete conduits that extend through the housing and the process configuration insert, wherein the proximity face can be positioned proximate to the surface of the substrate.

2. An apparatus for generating a fluid meniscus as recited in claim 1, further comprising:
    a cover being configured to be attachable to the walls of the housing to at least partially enclose the process configuration insert within the housing.

3. An apparatus for generating a fluid meniscus as recited in claim 1, wherein the plurality of discrete conduits enable definition of the fluid meniscus.

4. An apparatus for generating a fluid meniscus as recited in claim 3, wherein the plurality of discrete conduits include at least one of a first inlet for applying a first fluid to the substrate surface, a second inlet for applying a second fluid to the substrate surface, and an outlet for removing the first fluid and the second fluid from the substrate surface.

5. An apparatus for generating a fluid meniscus as recited in claim 3, wherein the plurality of discrete conduits include at least one of a first inlet for applying a first fluid to the substrate surface, a second inlet for applying a second fluid to the substrate surface, and an outlet for removing the first fluid and the second fluid from the substrate surface.

6. An apparatus for generating a fluid meniscus as recited in claim 3, wherein the process configuration insert is removable and replaceable with a different process configuration insert with a different plurality discrete conduits with a different configuration than the plurality of discrete conduits of the process configuration insert.

7. An apparatus for generating a fluid meniscus as recited in claim 6, wherein the different plurality of discrete conduits of the different configuration insert is capable of generating a fluid meniscus with a different configuration.

8. An reconfigurable proximity head for generating a fluid meniscus to be formed on a substrate, the reconfigurable proximity head comprising:
   a housing body having walls extending between a process side and a cover side, the walls defining an opening at the cover side, and the process side having flat surface regions and further define a receiving region opening, the process side having the flat surface regions including a first set of discrete conduits in a first configuration;
   a process configuration insert configured to sit within the housing body and extend through the opening at the cover side and into the receiving region opening, the process configuration insert having an insert surface defined by flat surface regions, the insert surface includes a second set of discrete conduits in a second configuration,
   wherein the insert surface of the process configuration insert and the process side of the housing body define a proximity face having the first and second sets of discrete conduits with both the first configuration and the second configuration.

9. The reconfigurable proximity head as recited in claim 8, further comprising:
   a cover for attachment to the walls of the housing body to at least partially enclose the process configuration insert within the housing.

10. The reconfigurable proximity head as recited in claim 8, further comprising,
    an alternate process configuration insert having a third configuration of discrete conduits, wherein the third configuration is different than the second configuration,
    wherein the proximity face includes the first configuration and the third configuration when the alternate process configuration insert replaces another process configuration insert.

* * * * *